(12) United States Patent
Hong

(10) Patent No.: US 12,389,594 B2
(45) Date of Patent: Aug. 12, 2025

(54) INTEGRATED CIRCUIT DEVICE AND ELECTRONIC SYSTEM INCLUDING SAME

(71) Applicant: SAMSUNG ELECTRONICS CO., LTD., Suwon-si (KR)

(72) Inventor: Sangbeom Hong, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 654 days.

(21) Appl. No.: 17/549,924

(22) Filed: Dec. 14, 2021

(65) Prior Publication Data

US 2022/0208781 A1   Jun. 30, 2022

(30) Foreign Application Priority Data

Dec. 28, 2020   (KR) .................. 10-2020-0184699

(51) Int. Cl.
  *H10B 41/27* (2023.01)
  *G11C 5/02* (2006.01)
  *H10B 43/27* (2023.01)

(52) U.S. Cl.
  CPC ............. *H10B 41/27* (2023.02); *G11C 5/025* (2013.01); *H10B 43/27* (2023.02)

(58) Field of Classification Search
  CPC .................................................... H10B 41/27
  USPC ....................................................... 257/314
  See application file for complete search history.

(56) References Cited

U.S. PATENT DOCUMENTS

| | | | |
|---|---|---|---|
| 7,989,880 B2 | 8/2011 | Wada et al. | |
| 8,492,824 B2 | 7/2013 | Yahashi | |
| 9,305,935 B2 | 4/2016 | Lee et al. | |
| 10,727,115 B2 | 7/2020 | Nam et al. | |
| 2019/0326166 A1* | 10/2019 | Nam | H10B 43/27 |
| 2019/0386021 A1 | 12/2019 | Lindsay et al. | |

(Continued)

FOREIGN PATENT DOCUMENTS

| | | |
|---|---|---|
| CN | 110335868 A | 10/2019 |
| CN | 111244030 A | 6/2020 |
| KR | 1020040001741 | 1/2004 |

*Primary Examiner* — Hsin Yi Hsieh
(74) *Attorney, Agent, or Firm* — Fish & Richardson P.C.

(57) ABSTRACT

An integrated circuit device includes; a semiconductor substrate having a cell region and a connection region, a gate stack including gate electrodes and insulating layers alternately stacked and having a stair-stepped structure in the connection region covered by a cover insulating layer. The gate electrodes extend from the cell region to the connection region to terminate in a corresponding pad portion and include lower gate electrodes disposed in a lower portion of the stair-stepped structure, upper gate electrodes disposed in an upper portion of the stair-stepped structure, and middle gate electrodes disposed between the lower gate electrodes and the upper gate electrodes. A contact plug disposed in the connection region includes; first contact plug portions contacting pad portions of the lower gate electrodes, second contact plug portions contacting pad portions of the middle gate electrodes, and third contact plug portions contacting pad portions of the upper gate electrodes. A second diameter of the second contact plug portions is less than a first diameter of the first contact plug portions, and the second diameter is less than a third diameter of the third contact plug portions.

10 Claims, 21 Drawing Sheets

(56) References Cited

U.S. PATENT DOCUMENTS

2023/0087072 A1\* 3/2023 Kang .................... H10B 43/40
438/197

\* cited by examiner

INTEGRATED CIRCUIT DEVICE AND ELECTRONIC SYSTEM INCLUDING SAME

CROSS-REFERENCE TO RELATED APPLICATION

This application claims priority under 35 U.S.C. § 119 to Korean Patent Application No. 10-2020-0184699 filed on Dec. 28, 2020 in the Korean Intellectual Property Office, the subject matter of which is hereby incorporated by reference.

BACKGROUND

The inventive concept relates generally integrated circuit devices and electronic systems including same. More particularly, the inventive concept relates to integrated circuit devices including a nonvolatile vertical memory device and an electronic system including same.

It is required to increase a degree of integration of an integrated circuit device to provide high performance and realize economic feasibility. In particular, a degree of integration of a memory device is an important factor that determines the economic feasibility of a product. A degree of integration of a two-dimensional memory device is largely determined by an area of a unit memory cell, and is thus greatly affected by the level of micro-pattern formation technology. However, expensive equipment is required to form micro-patterns, and an area of a chip die is limited, and thus, although the degree of integration of a two-dimensional memory device is increasing, the increase is still limited. Thus, a vertical memory device having a three-dimensional structure is required.

SUMMARY

The inventive concept provides integrated circuit devices exhibiting improved product reliability, as well as electronic systems including such integrated circuit devices. Among other beneficial aspects, embodiments of the inventive concept provide improved product reliability by reducing difficulties in the manufacturing process of certain integrated circuit devices. Among other aspects, this may be accomplished by providing a contact plug including multiple contact plug portions have differently sized diameters. These contact plug portions may be used to respectively connect gate electrodes extending into a connection region.

According to an aspect of the inventive concept, there is provided an integrated circuit device including; a semiconductor substrate having a cell region and a connection region adjacent to the cell region, a gate stack including gate electrodes and insulating layers alternately stacked and having a stair-stepped structure in the connection region covered by a cover insulating layer, wherein each one of the gate electrodes extends from the cell region to the connection region to terminate in a corresponding pad portion, and the gate electrodes include lower gate electrodes disposed in a lower portion of the stair-stepped structure, upper gate electrodes disposed in an upper portion of the stair-stepped structure, and middle gate electrodes disposed between the lower gate electrodes and the upper gate electrodes, and a contact plug disposed in the connection region and including; first contact plug portions extending through the cover insulating layer to respectively contact pad portions of the lower gate electrodes, second contact plug portions extending through the cover insulating layer to respectively contact pad portions of the middle gate electrodes, and third contact plug portions extending through the cover insulating layer to respectively contact pad portions of the upper gate electrodes, wherein a second diameter at an upper surface of at least one of the second contact plug portions is less than a first diameter at an upper surface of at least one of the first contact plug portions, and the second diameter is less than a third diameter at an upper surface of at least one of the third contact plug portions.

According to an aspect of the inventive concept, there is provided an integrated circuit device including; a semiconductor substrate having a cell region and a connection region adjacent to the cell region, a gate stack including gate electrodes and insulating layers alternately stacked, wherein each one of the gate electrodes extends from the cell region to the connection region to terminate in a corresponding pad portion, and the gate electrodes include first gate electrodes, second gate electrodes, third gate electrodes and fourth gate electrodes, channel structures disposed in the cell region and extending through the gate stack, and a contact plug disposed in the connection region and including first contact plug portions respectively contacting pad portions of the first gate electrodes, second contact plug portions respectively contacting pad portions of second gate electrodes, third contact plug portions respectively contacting pad portions of the third gate electrodes, and fourth contact plug portions respectively contacting pad portions of the fourth gate electrodes, wherein a second diameter at an upper surface of any one of the second contact plug portions is less than a first diameter at an upper surface of any one of the first contact plug portions.

According to an aspect of the inventive concept, there is provided an electronic system including a substrate, an integrated circuit device on the substrate, and a controller on the substrate and electrically connected to the integrated circuit device. The integrated circuit device includes; a semiconductor substrate having a cell region and a connection region adjacent to the cell region, a gate stack including gate electrodes and insulating layers alternately stacked and having a stair-stepped structure in the connection region, wherein each one of the gate electrodes extends from the cell region to the connection region to terminate at a corresponding pad portion, and the gate electrodes include lower gate electrodes disposed in a lower portion of the stair-stepped structure, upper gate electrodes disposed in an upper portion of the stair-stepped structure, and middle gate electrodes disposed between the lower gate electrodes and the upper gate electrodes, a contact plug disposed in the connection region and including first contact plug portions respectively contacting pad portions of the lower gate electrodes, second contact plug portions respectively contacting pad portions of the middle gate electrodes, and third contact plug portions respectively contacting pad portions of the upper gate electrodes. A second diameter at an upper surface of at least one of the second contact plug portions is less than a first diameter at an upper surface of at least one of the first contact plug portions, and the second diameter is less than a third diameter at an upper surface of at least one of the third contact plug portions.

BRIEF DESCRIPTION OF THE DRAWINGS

Embodiments of the inventive concept may be more clearly understood upon consideration of the following detailed description together with the accompanying drawings in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/middle/lower; center/side; center/surrounding; overlay/underlay, etc.

Figure 1:
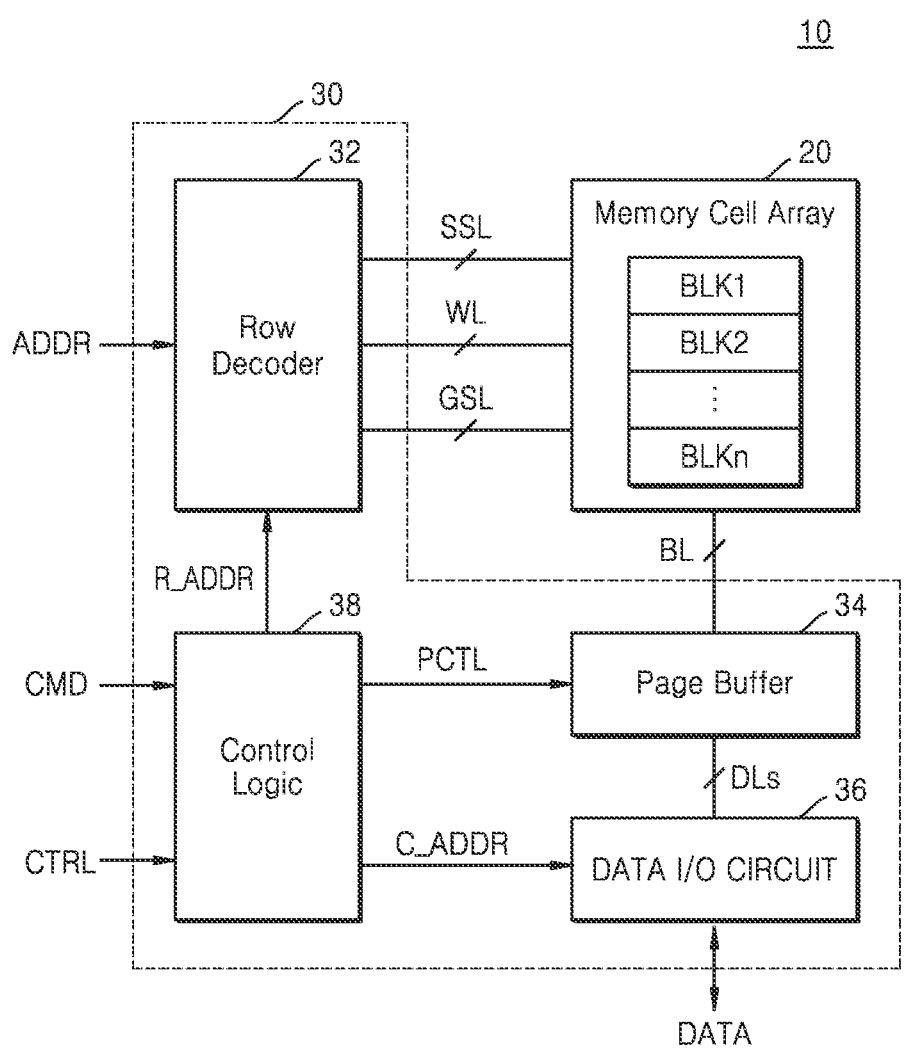
FIG. 1 is a block diagram illustrating an integrated circuit device according to an embodiment of the inventive concept.

FIG. 1 is a block diagram illustrating an integrated circuit device according to an embodiment of the inventive concept.

Referring to FIG. 1, an integrated circuit device 10 may include a memory cell array 20 and a peripheral circuit 30.

The memory cell array 20 may include memory cell blocks BLK1, BLK2, ..., BLKn. Each of the memory cell blocks BLK1, BLK2, ..., BLKn may include a vast multiplicity of memory cells. The memory cell blocks BLK1, BLK2, ..., BLKn may be connected to the peripheral circuit 30 via a bit line BL, a word line WL, a string select line SSL, and a ground select line GSL.

The memory cell array 20 may be connected to a page buffer 34 via the bit line BL, and connected to a row decoder 32 via the word line WL, the string select line SSL, and the ground select line GSL. In some embodiments, in the memory cell array 20, each of the memory cells included in the memory cell blocks BLK1, BLK2, ..., BLKn may be a flash memory cell. The memory cell array 20 may include a three-dimensional (3D) memory cell array. The 3D memory cell array may include NAND strings, wherein each of the NAND strings may include vertically stacked memory cells connected to word lines WL.

The peripheral circuit 30 may include the row decoder 32, the page buffer 34, a data I/O circuit 36, and a control logic 38. Although not illustrated, the peripheral circuit 30 may further include various circuits such as a voltage generation circuit generating various voltages needed for an operation of the integrated circuit device 10, an error correction circuit correcting an error of data read from the memory cell array 20, and an input/output (I/O) interface, or the like.

The peripheral circuit 30 may receive at least one of address(es) ADDR, command(s) CMD, and control signal(s) CTRL from an external source, and may communicate (i.e., transmit and/or receive) data DATA with one or more external source(s).

One exemplary configuration for the peripheral circuit 30 is be described hereafter.

The row decoder 32 may select at least one of the memory cell blocks BLK1, BLK2, ..., BLKn in response to an address ADDR, and may select a word line WL, a string select line SSL, and/or a ground select line GSL of the selected memory cell block. The row decoder 32 may transfer a voltage for performing a memory operation to the word line WL of the selected memory cell block.

The page buffer 34 may be connected to the memory cell array 20 via the bit line BL. The page buffer 34 may operate as a write driver during a write (or program) operation, and may apply to the bit line BL a voltage according data DATA to be stored in the memory cell array 20. The page buffer 34 may also operate as a sense amplifier during a read operation and sense data DATA stored in the memory cell array 20. The page buffer 34 may operate according to a control signal PCTL provided from the control logic 38.

The data I/O circuit 36 may be connected to the page buffer 34 via data line DLs. The data I/O circuit 36 may receive data DATA from a memory controller (not shown) during a program operation, and provide program data DATA to the page buffer 34 in response to a column address C_ADDR provided from the control logic 38. The data I/O circuit 36 may provide read data DATA stored in the page buffer 34 to the memory controller during a read operation in response to the column address C_ADDR provided from the control logic 38. The data I/O circuit 36 may transfer the applied address and/or command to the control logic 38 or the row decoder 32.

The control logic 38 may receive a command CMD and a control signal CTRL from the memory controller. The control logic 38 may provide a row address R_ADDR to the row decoder 32 and a column address C_ADDR to the data I/O circuit 36. The control logic 38 may generate various internal control signals used in the integrated circuit device 10 in response to the control signal CTRL. For example, when performing a memory operation such as a program operation or an erase operation, the control logic 38 may adjust a voltage level provided to the word line WL and the bit line BL.

Figure 2:
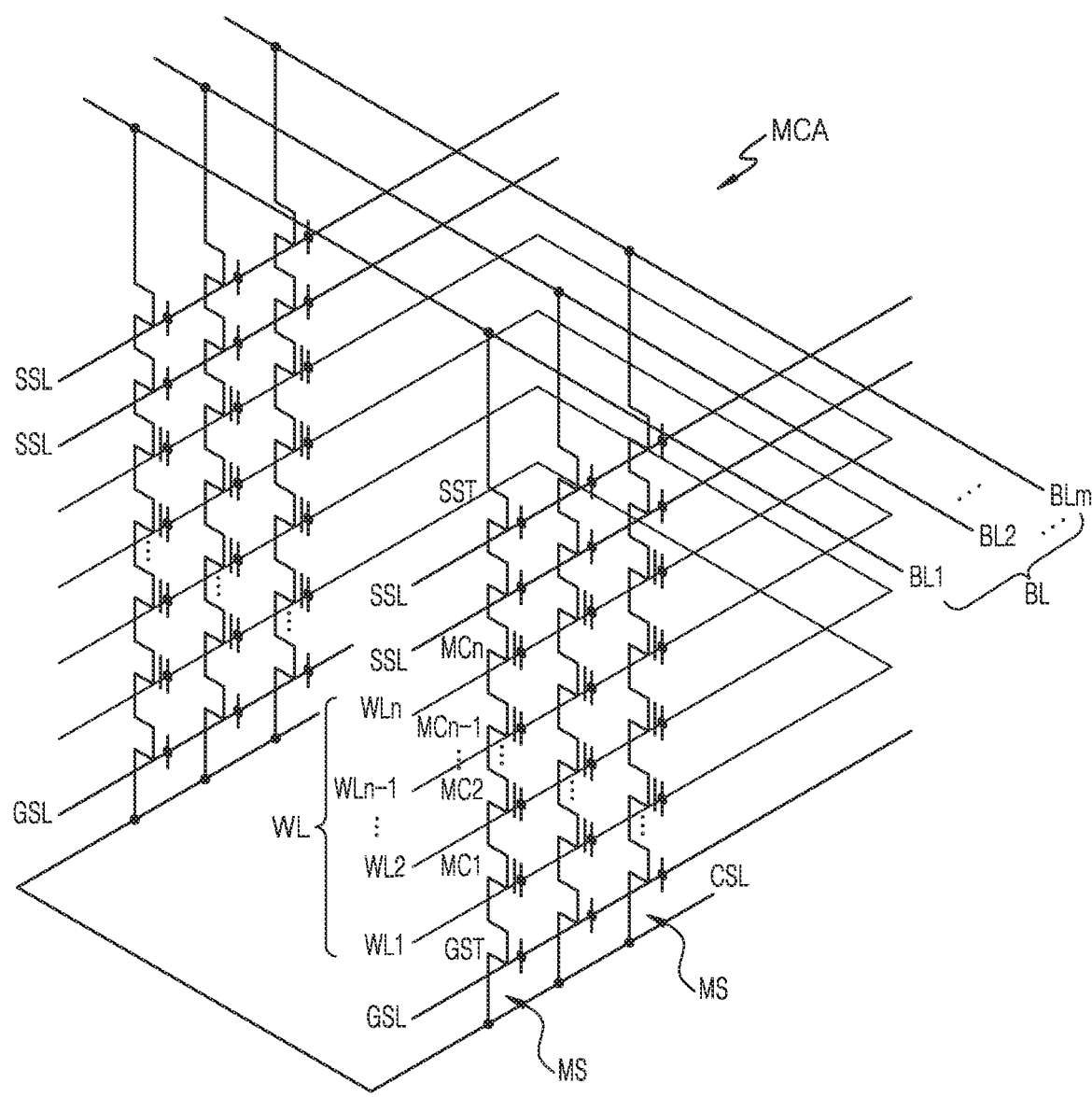
FIG. 2 is an equivalent circuit diagram of a memory cell array of an integrated circuit device according to an embodiment of the inventive concept.

FIG. 2 is a partial equivalent circuit diagram of a memory cell array of an integrated circuit device according to an embodiment, and assumes the use of a vertical NAND flash memory device having a vertical channel structure.

A memory cell array MCA may include memory cell strings MS. The memory cell array MCA may include bit lines BL, word lines WL, at least one string select line SSL, at least one ground select line GSL, and a common source line CSL.

The memory cell strings MS may be respectively disposed between the bit lines BL and the common source line CSL. While the memory cell strings MS may include two string select lines SSL as illustrated in FIG. 2, the inventive concept is not limited thereto. For example, each of the memory cell strings MS may include a single string select line SSL.

Each of the memory cell strings MS may include a string select transistor SST, a ground select transistor GST, and memory cell transistors (e.g., MC1, MC2, . . . , MCn−1, MCn). A drain region of the string select transistor SST may be connected to the bit line BL, and a source region of the ground select transistor GST may be connected to the common source line CSL. The common source line CSL may be a region to which source regions of ground select transistors GST are commonly connected.

The string select transistor SST may be connected to the string select line SSL, and the ground select transistor GST may be connected to the ground select line GSL. The memory cell transistors MC1, MC2, . . . , MCn−1, MCn may be respectively connected to the word lines WL.

Figure 3:
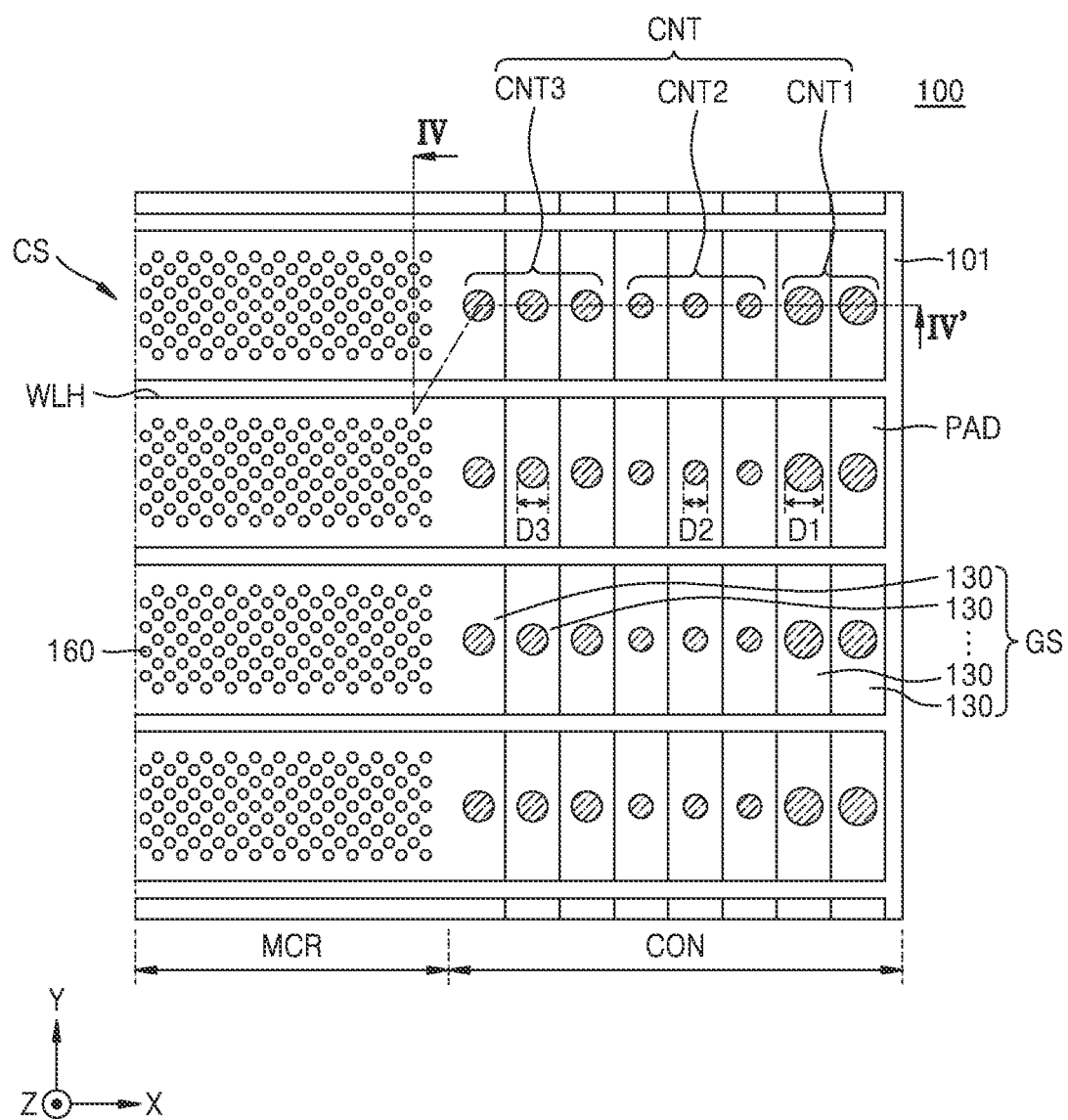
FIG. 3 is a plan view illustrating components of an integrated circuit device according to an embodiment of the inventive concept.
Figure 4:
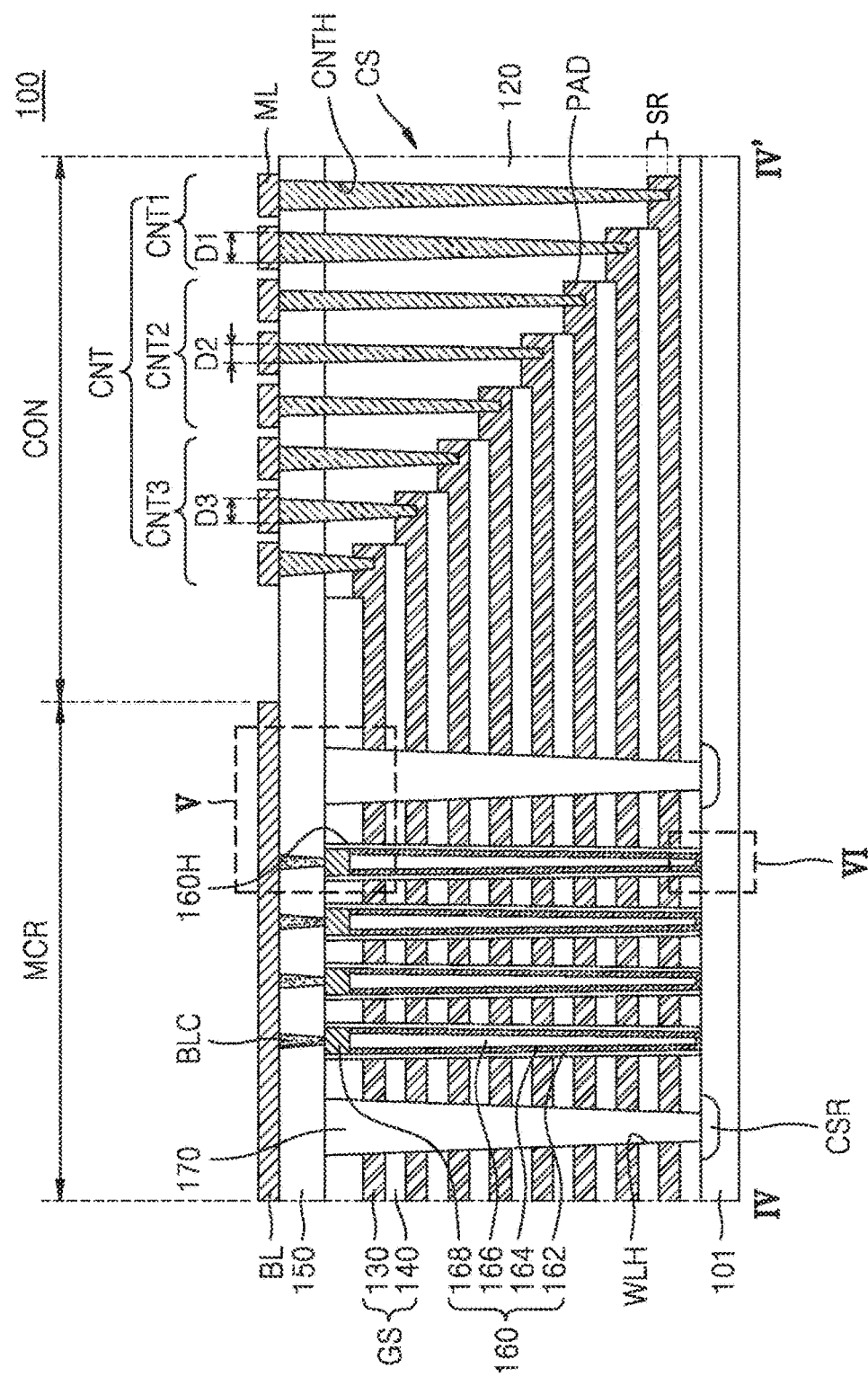
FIG. 4 is a cross-sectional view taken along line IV-IV' of FIG. 3.
Figure 5:
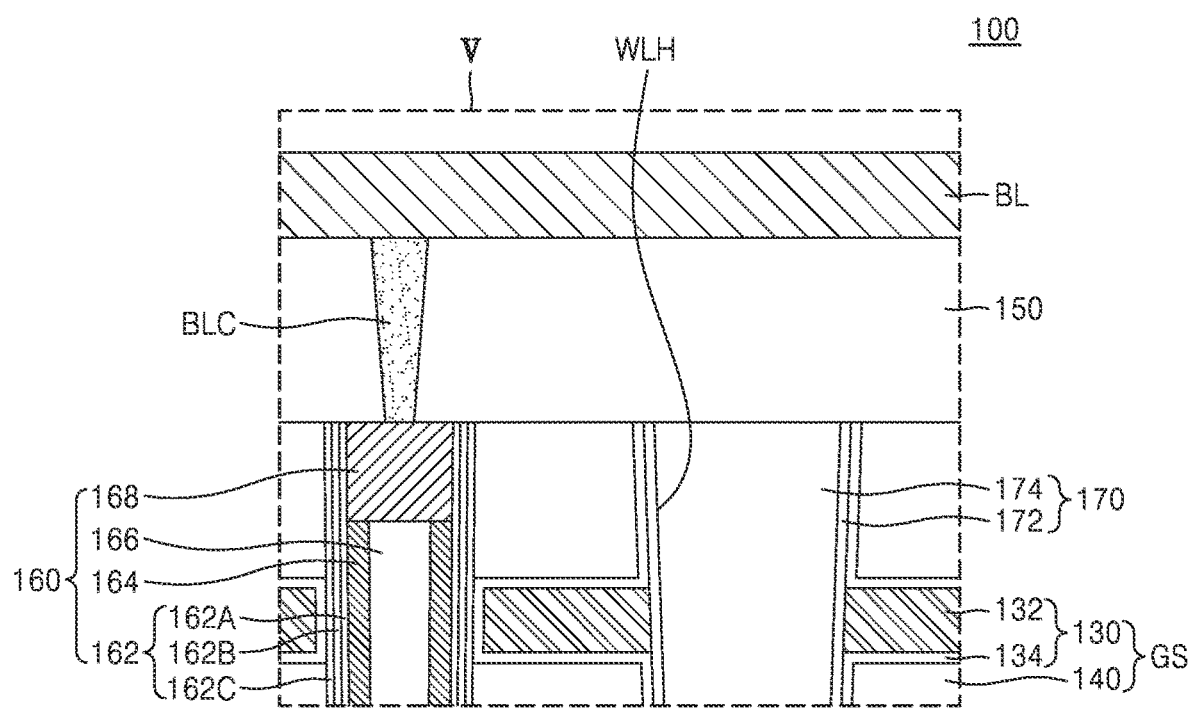
FIG. 5 is an enlarged view of region 'V' indicated in FIG. 4.
Figure 6:
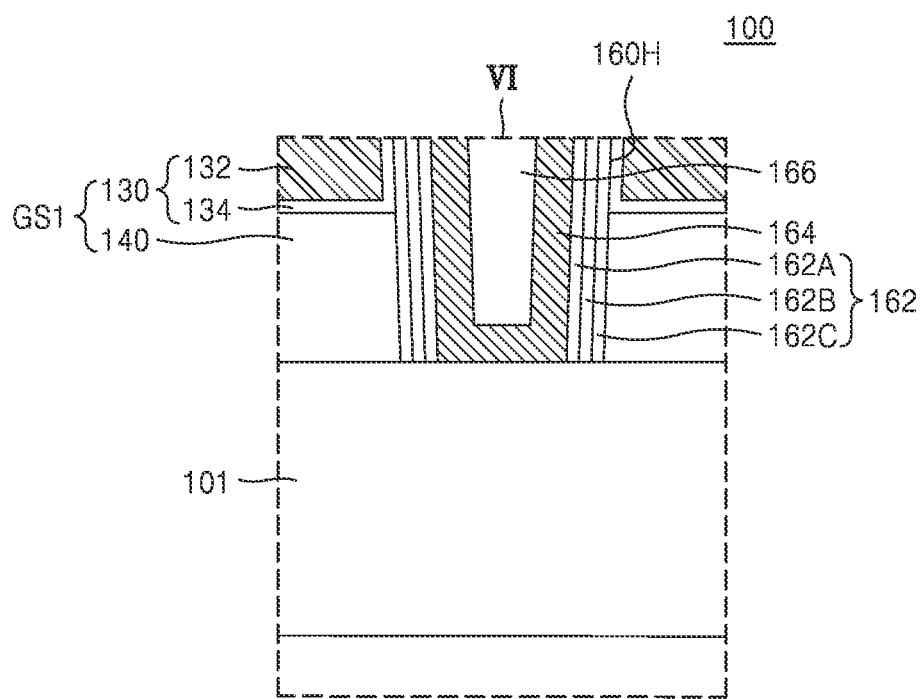
FIG. 6 is an enlarged view of region 'VI' indicated in FIG. 4.

FIG. 3 is a plan view illustrating components of an integrated circuit device according to an embodiment of the inventive concept; FIG. 4 is a cross-sectional view taken along line IV-IV' of FIG. 3; FIG. 5 is an enlarged view of region 'V' indicated in FIG. 4; and FIG. 6 is an enlarged view of region 'VI' indicated in FIG. 4.

Referring collectively to FIGS. 3, 4, 5, and 6, an integrated circuit device 100 may include a cell array structure CS including a memory cell region MCR and a connection region CON.

In some embodiments, the memory cell region MCR may be a region in which a memory cell array MCA may be formed. Here, the MCA is assumed to include NAND type memory cells. having vertical channel structures like those previously described in relation to FIG. 2. The connection region CON may be a region in which various pad portions PAD may be formed. Here, the pad portions PAD may serve as respective electrical connections between various elements or components disposed in the memory cell region MCR and elements or components disposed in a peripheral circuit region (not shown).

A semiconductor substrate 101 may include a semiconductor material, for example, a Group IV semiconductor, a Group III-V compound semiconductor, or a Group II-VI oxide semiconductor. For example, a Group IV semiconductor may include silicon (Si), germanium (Ge), or Si—Ge. The semiconductor substrate 101 may also be provided as a bulk wafer or a wafer on which an epitaxial layer is formed. In other embodiments, the semiconductor substrate 101 may include a silicon on insulator (SOI) substrate or a germanium on insulator (GeOI) substrate.

A gate stack GS may be disposed in a first direction (e.g., an X direction) and a second direction (e.g., a Y direction) extending substantially in parallel with a principal surface (e.g., an upper surface) of the semiconductor substrate 101, wherein the first direction intersects the second direction. Here, the gate stack GS may include alternatingly gate electrodes 130 and insulating layers 140 "stacked" one upon the other in a third direction (e.g., a Z direction) substantially perpendicular to the principal surface of the semiconductor substrate 101.

Also, an upper insulating layer 150 may be arranged on the gate stack GS.

In some embodiments, each one of the gate electrodes 130 may include a buried conductive layer 132 and an insulating liner 134 surrounding an upper surface, a bottom surface, and a side surface of the buried conductive layer 132. In this regard, the buried conductive layer 132 may include a metal (e.g., tungsten), a metal silicide (e.g., tungsten silicide), doped polysilicon, or a combination thereof. In some embodiments, the insulating liner 134 may include a high-k dielectric material such as an aluminum oxide.

Each one of the gate electrodes 130 may correspond to the ground select line GSL, one of the word lines WL, and the at least one string select line SSL—referencing the memory cell string MS previously described in relation to FIG. 2. For example, a lowermost gate electrode 130 in the gate stack GS may function as the ground select line GSL, an uppermost gate electrode 130 in the gate stack GS may function as the string select line SSL, and other gate electrodes 130 in the gate stack GS may respectively function as a word line WL. Accordingly, a memory cell string MS may include a serially connected arrangement of the ground select transistor GST, the memory cell transistors MC1, MC2, . . . , MCn−1, MCn, and the string select transistor SST.

Word line cuts 170 may extend on the semiconductor substrate 101 in the first direction. The gate stack GS may be disposed between adjacent word line cuts 170, such that a separation distance between the adjacent word line cuts 170 defines a width of the gate stack GS in the second direction. In some embodiments, the word line cuts 170 may include an insulation spacer 172 and an insulation separation layer 174. That is, the word line cuts 170 may include an insulating structure. Common source regions CRS may be formed in the semiconductor substrate 101 in relation to each word line cut 170, wherein each common source region CRS may be an impurity-doped region doped with a high-density of impurities.

Channel structures 160 may extend in the third direction to respectively pass through the gate electrodes 130 from the upper surface of the semiconductor substrate 101 in the memory cell region MCR. The channel structures 160 may be spaced apart in the first direction and the second direction. The channel structures 160 may be arranged (e.g.,) in a zigzag pattern or a staggered pattern.

Each of the channel structures 160 may extend within a channel hole 160H to pass through the gate stack GS. In some embodiments, each of the channel structures 160 may include a gate insulating layer 162, a channel layer 164, a buried insulating layer 166, and a conductive plug 168. The gate insulating layer 162 and the channel layer 164 may be sequentially arranged on a side wall of the channel hole 160H. For example, the gate insulating layer 162 may be arranged conformally on a side wall of the channel hole 160H, and the channel layer 164 may be conformally arranged on the side wall and a bottom portion of the channel hole 160H. The buried insulating layer 166 filling a remaining space of the channel hole 160H may be arranged on the channel layer 164. The conductive plug 168 contacting the channel layer 164 and blocking an entrance of the channel hole 160H (e.g., at an uppermost end) may be arranged in an upper portion of the channel hole 160H. Alternately, the buried insulating layer 166 may be omitted, and the channel layer 164 may be formed in a pillar shape filling the remaining portion of the channel hole 160H.

The channel structures 160 may respectively contact the semiconductor substrate 101. In some embodiments, the channel layer 164 may be arranged to contact the upper surface of the semiconductor substrate 101 on the bottom portion of the channel hole 160H. Alternately, a contact semiconductor layer (not shown) having a certain height on the semiconductor substrate 101 on the bottom portion of the channel hole 160H may be formed, and the channel layer 164 may be electrically connected to the semiconductor substrate 101 via the contact semiconductor layer.

The gate insulating layer 162 may include a tunneling dielectric layer 162A, a charge storage layer 162B, and a blocking dielectric layer 162C that are sequentially formed on an outer side wall of the channel layer 164. Relative thicknesses of the tunneling dielectric layer 162A, the charge storage layer 162B, and the blocking dielectric layer 162C of the gate insulating layer 162 are not limited to the illustrated ones, and may be modified in various manners.

The tunneling dielectric layer 162A may include silicon oxide, hafnium oxide, aluminum oxide, zirconium oxide, tantalum oxide, or the like. The charge storage layer 162B may be a region in which electrons that have passed through the tunneling dielectric layer 162A from the channel layer 164 may be stored, and may include silicon nitride, boron nitride, silicon boron nitride, or impurity-doped polysilicon. The blocking dielectric layer 162C may include silicon oxide, silicon nitride, or a metal oxide having a higher permittivity than silicon oxide.

In each memory cell block, an uppermost gate electrode 130 may be divided into two portions two-dimensionally via a string separation insulating layer (not shown). Thus, these two portions may constitute the string select line SSL as previously described in relation to FIG. 2.

In the connection region CON, each of the gate electrodes 130 may (laterally) extend to terminate (or form) the pad portion PAD at a distal end of the gate electrode 130 with respect to the memory cell region MCR, wherein a cover insulating layer 120 may be disposed to cover the pad portion PAD. In some embodiments, the distal end of the gate electrode 130 may have a greater thickness than other portions of the gate electrode 130. That is, the pad portion PAD may have an upper surface that is "higher" (e.g., with respect to the principal surface of the semiconductor substrate 101) than the upper surface of other portions of the gate electrode 130, but the inventive concept is not limited thereto.

As illustrated in FIG. 4, for example, in the connection region CON, each of the gate electrodes 130 stacked between a lowermost gate electrode to an uppermost gate electrode may extend a lesser distance in the first direction than an adjacent, underlying one of the gate electrodes 130. Hence, the lowermost gate electrode may extend a greatest distance in the first direction, and the uppermost gate electrode 130 may extend a least distance in the first direction. Hereafter, this type of gate electrode arrangement for a gate stack GS in the connection region CON will be referred to as a "stair-stepped structure."

A contact plug CNT, including multiple contact plug portions, may pass through the cover insulating layer 120 to connect at least one pad portion PAD associated with at least one gate electrode 130. Thus, each contact plug portion may be arranged in a corresponding contact hole CNTH in the connection region CON. In some embodiments, each contact plug portion may have a tapered pillar shape. In this regard, the term "tapered pillar shape" denotes a shape wherein the diameter (or width, measured in at least one of the first direction or the second direction) of a vertically extending pillar structure decreases as the pillar structure descends in the third direction towards the semiconductor substrate 101.

In the illustrated example of FIG. 4, the contact plug CNT includes at least first contact plugs CNT1, second contact plugs CNT2, and third contact plugs CNT3, wherein the first contact plugs CNT1 vertically extend to contact lower gate electrode(s) in the stair-stepped structure, second contact plugs CNT2 vertically extend to contact middle gate electrode(s) in the stair-stepped structure, and third contact plugs CNT3 vertically extend to contact upper gate electrode(s) in the stair-stepped structure. As a result, a first distance in the first direction between the memory cell region MCR and any one of the first contact plugs CNT1 will be greater than a second distance between the memory cell region MCR and any one of the second contact plugs CNT2. Further, the second distance will be greater than a third distance between the memory cell region MCR and any one of the third contact plugs CNT3.

In some embodiments, the second contact plug portions respectively contact pad portions of gate electrodes disposed between ¼ to ½ of a height of the gate structure as measured from an upper surface of the semiconductor substrate.

In some embodiments, the various contact holes CNTH may be configured such that uppermost surfaces of the different contact plug portions have different diameters that vary with positioning of the contact plug portions within the connection region CON. For example, uppermost surfaces of the first contact plugs CNT1 may have a first diameter D1, uppermost surfaces of the second contact plugs CNT2 may have a second diameter D2, and uppermost surfaces of the third contact plugs CNT3 may have a third diameter D3, wherein the second diameter D2 may be less than the first and third diameters D1 and D3, and the first diameter D1 may be greater than the third diameter D3. In some embodiments, for example, the second diameter D2 may range from about 90% to about 95% of the first diameter D1, and the second diameter D2 may range from about 95% to about 99% of the third diameter D3. However, these are just illustrative examples and the inventive concept is not limited thereto.

Alternately, respective diameters for a particular type (or group) of contact plug portions (e.g., the first contact plug portions CNT1) may vary with layout configuration and/or connection purpose. For example, a first diameter of one of the first contact plug portions CNT1 contacting the lowermost gate electrode among the gate electrodes 130 may be greater than a diameter of another one of the first contact plug portions CNT1.

However, in some embodiments, respective first diameters D1 of first contact plugs CNT1 may be substantially the same, respective second diameters D2 of the second contact plugs CNT2 may be substantially the same, and/or respective third diameters D3 of third contact plugs CNT3 may be substantially the same.

Although not specifically illustrated in FIG. 4, one of more dummy channel structures may extend through the gate stack GS in the third direction in the connection region CON. The dummy channel structures may be formed to prevent curving, skewing or bending of the gate stack GS during manufacture of the integrated circuit device 100 to better ensure structural stability.

A bit line contact BLC may pass through the upper insulating layer 150 to electrically connect the conductive plug 168 of the channel structures 160 with the bit line BL extending across the upper insulating layer 150 in the second direction.

A conductive line ML may be formed on the upper insulating layer 150 in the connection region CON. Although not specifically illustrated in FIG. 4, an upper support layer may be formed between the upper insulating layer 150 and the bit line BL, as well as between the upper insulating layer 150 and the conductive line ML.

As the vertical height of the gate stack GS increases, so too does the aspect ratio of the contact plug CNT. That is, a ratio between a height of the contact plug CNT and a width of the contact plug CNT increases. In particular, assuming a gate structure GS including multiple gate electrodes 130, an aspect ratio for the contact plug CNT may increase.

By way of comparison with the foregoing, in conventional integrated circuit devices, contact holes are configured such that contact plugs arranged in a connection region have an equal diameter, regardless of positioning of respective contact plugs. However, as the number of gate electrodes in gate stacks of conventional integrated circuits increases, contact hole depths for contact plugs associated with the lowermost gate electrode have also increased. These very deep contact holes may result in over-etching of some the contact holes, thereby causing excessive surface recesses in a pad portion of a gate electrode, or causing a contact hole to pass through the pad portion. Thus, as the thickness of a gate electrode portion associated with the pad portion increases to prevent these problems, another problem may arise of increasing the level of difficulty of a replacement process of forming a gate electrode by substituting a sacrificial layer with an electrode layer.

Thus, to address at least the foregoing problems, in the integrated circuit device 100 of FIGS. 3, 4, 5, and 6, various contact holes CNTH may be configured with different diameters with respect to two or more contact plug portions (e.g., CNT1, CNT2, and CNT3) that respectively contact the pad portions PAD associated with gate electrodes 130 in the connection region CON.

In this regard, an examination of surface recesses of the pad portion PAD, as a function of etching depth for a contact hole CNTH have been conducted. (See, e.g., FIG. 7). Accordingly, the diameter of some contact holes (e.g., those associated with the second contact plugs CNT2 contacting the middle layers of the stair-stepped structure) should be different from the diameter of other contact holes (e.g., those associated with structure and the first contact plugs CNT1 and/or the third contact plugs CNT3 respectively contacting the lower layers and upper layers of the stair-stepped structure).

That is, embodiments of the inventive concept greatly reduce or eliminate the possibility of contact hole over-etching, while still providing pad portions of substantially uniform thickness. For example, with respect to the integrated circuit device 100 of FIGS. 3, 4, 5 and 6, there is an ultimate effect of reducing the level of difficulty of a manufacturing process and increasing product reliability, as defects caused by contact hole etching are effectively reduced by appropriately providing differently sized contact holes.

Figure 7:
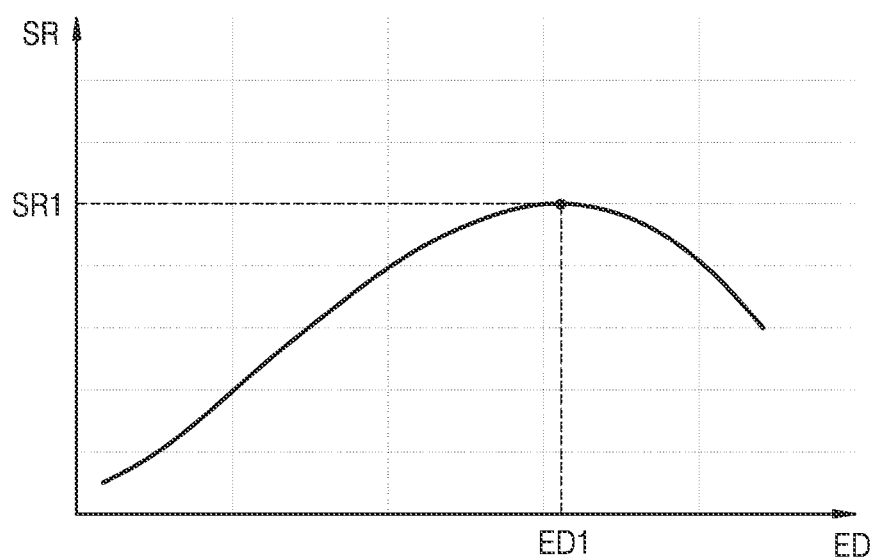
FIG. 7 is a graph illustrating surface recess of a pad portion in relation to etching depth of a contact hole.

FIG. 7 is a graph illustrating surface recess (SR) of a pad portion as a function of contact hole etching depth (ED).

Referring to FIGS. 4 and 7, until contact hole etching depth ED reaches a critical depth ED1, the greater the contact hole etching depth ED, the greater also the surface recess SR of the pad portion PAD. However, from the point in time at which the contact hole etching depth ED exceeds the critical depth ED1, the surface recess SR of the pad portion PAD continuously decreases as the contact hole etching depth ED increases.

That is, contact hole etching depth ED less than the critical depth ED1 may correspond to contact holes associated with upper layer(s) of the stair-stepped structure. Hence, as the contact hole etching depth ED is relatively small, the surface recess SR of the pad portion PAD may also be relatively small.

However, contact hole etching depth ED greater than the critical depth ED1 may correspond to contact holes associated with lower layer(s) of the stair-stepped structure. Hence, although the contact hole etching depth ED is relatively great, etching byproducts attach to the contact hole as etching is performed, there resulting in surface recess SR of the pad portion PAD that is also small.

Further, contact hole etching depth ED similar to (or about the same as) the critical depth ED1 may correspond to contact holes associated with middle layer(s) of the stair-stepped structure. In this case, while the contact hole etching depth ED may be relatively middling in depth, the surface recess SR may nonetheless be proportional to the contact hole etching depth ED. Hence, the surface recess SR of the pad portion PAD may be the greatest in relation to contact hole etching depths ED similar to the critical depth.

Thus, based on the foregoing, in order to compensate for a difference in the surface recess SR of the pad portion PAD in integrated circuit devices with respect to embodiments of the inventive concept, the size (or diameter) of contact hole(s) associated with middle layer(s) should be less than the size of contact holes associated with lower layer(s) and/or the size of contact holes associated with upper layer(s).

FIGS. 8 to 12 are cross-sectional views of integrated circuit devices (200, 300, 400 and 500) according to various embodiments of the inventive concept.

Most of the elements, components and/or features of integrated circuit devices 200, 300, 400, and 500 are substantially similar to those described previously described in relation to FIGS. 3, 4, 5, and 6. Thus, for convenience of description, only material differences will be highlighted between the integrated circuit device 100 and the integrated circuit devices 200, 300, 400 and 500. Here, FIG. 10 is an enlarged view of region 'X' indicated in FIG. 9.

Figure 8:
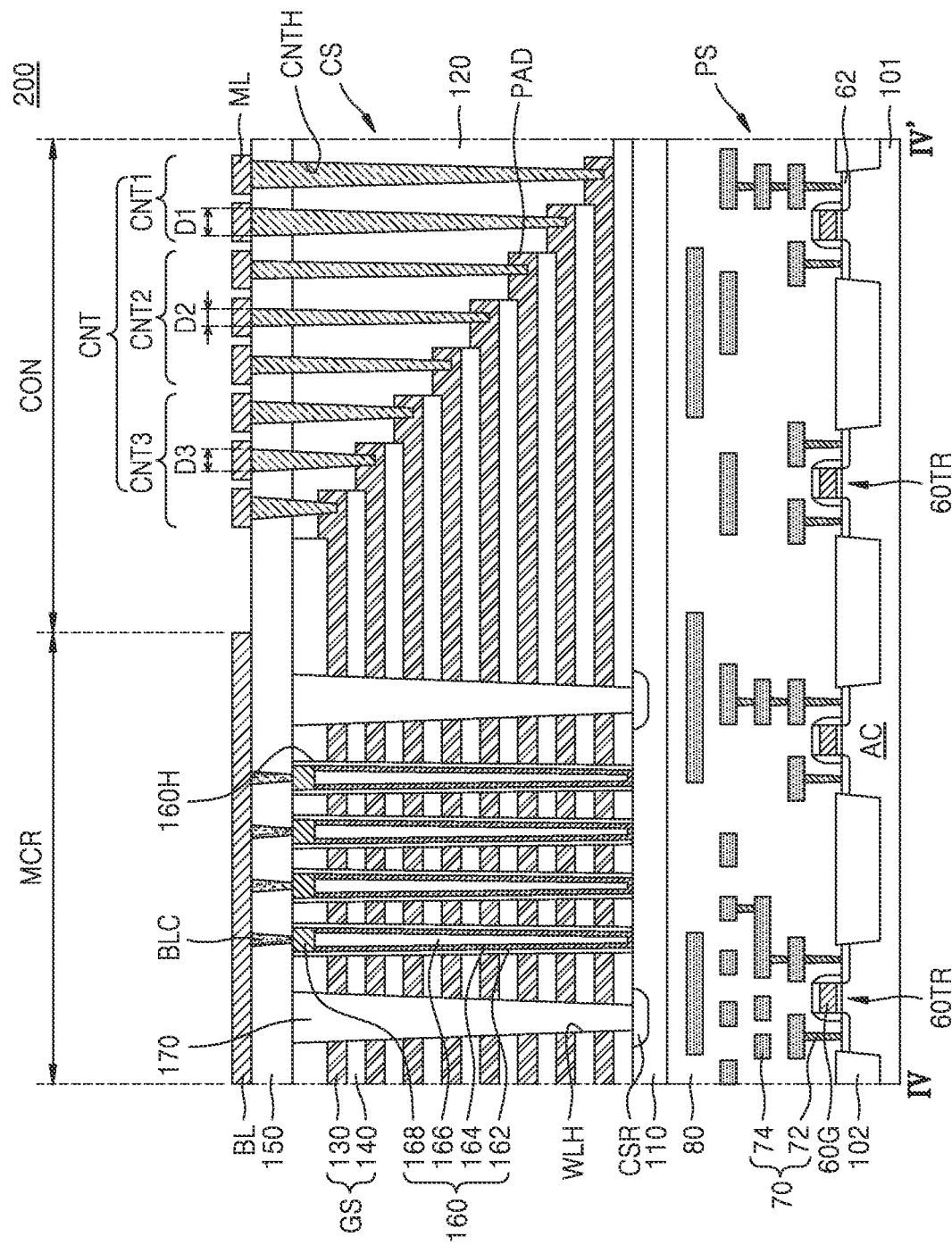
FIGS. 8, 9, 10, 11 and 12 (collectively, "FIGS. 8 to 12") are respective, cross-sectional views of integrated circuit devices (200, 300, 400 and 500) according to various embodiments of the inventive concept.

Referring to FIG. 8, the integrated circuit device 200 may further include, with respect to the integrated circuit device 100 of FIG. 4, a peripheral circuit structure PS, as well as a cell array structure CS disposed at a higher level than the peripheral circuit structure PS with respect to the semiconductor substrate 101.

The integrated circuit device 200 may have a cell on periphery (COP) structure in which the cell array structure CS is arranged on the peripheral circuit structure PS. A base structure 110 may be arranged between the peripheral circuit structure PS and the cell array structure CS.

The peripheral circuit structure PS may include a peripheral circuit transistor 60TR and a peripheral circuit wiring 70 arranged on the semiconductor substrate 101. An active region AC may be defined in the semiconductor substrate 101 by using a device isolation layer 102, and peripheral circuit transistors 60TR may be formed on the active region AC. The peripheral circuit transistors 60TR may include a peripheral circuit gate 60G and a source/drain region 62 arranged in a portion of the semiconductor substrate 101 on two sides of the peripheral circuit gate 60G.

The peripheral circuit wiring 70 may include peripheral circuit contacts 72 and peripheral circuit metal layers 74. An interlayer insulating layer 80 covering the peripheral circuit transistors 60TR and the peripheral circuit wiring 70 may be arranged on the semiconductor substrate 101. The peripheral circuit metal layers 74 may have a multi-layer structure including metal layers arranged at different vertical levels. Although the peripheral circuit metal layers 74 are illustrated to be at a same height in FIG. 8, alternatively, a peripheral circuit metal layer 74 arranged at some levels (for example, arranged at an uppermost level) may be formed at a higher height than the other peripheral circuit metal layers 74 arranged at other levels.

Here, the second diameter D2 (measured at upper ends) of the second contact plugs CNT2 may be less than the first and third diameters D1 and D3 of the first and third contact plugs CNT1 and CNT3. Also, the first diameter D1 may be greater than the third diameter D3.

Figure 9:
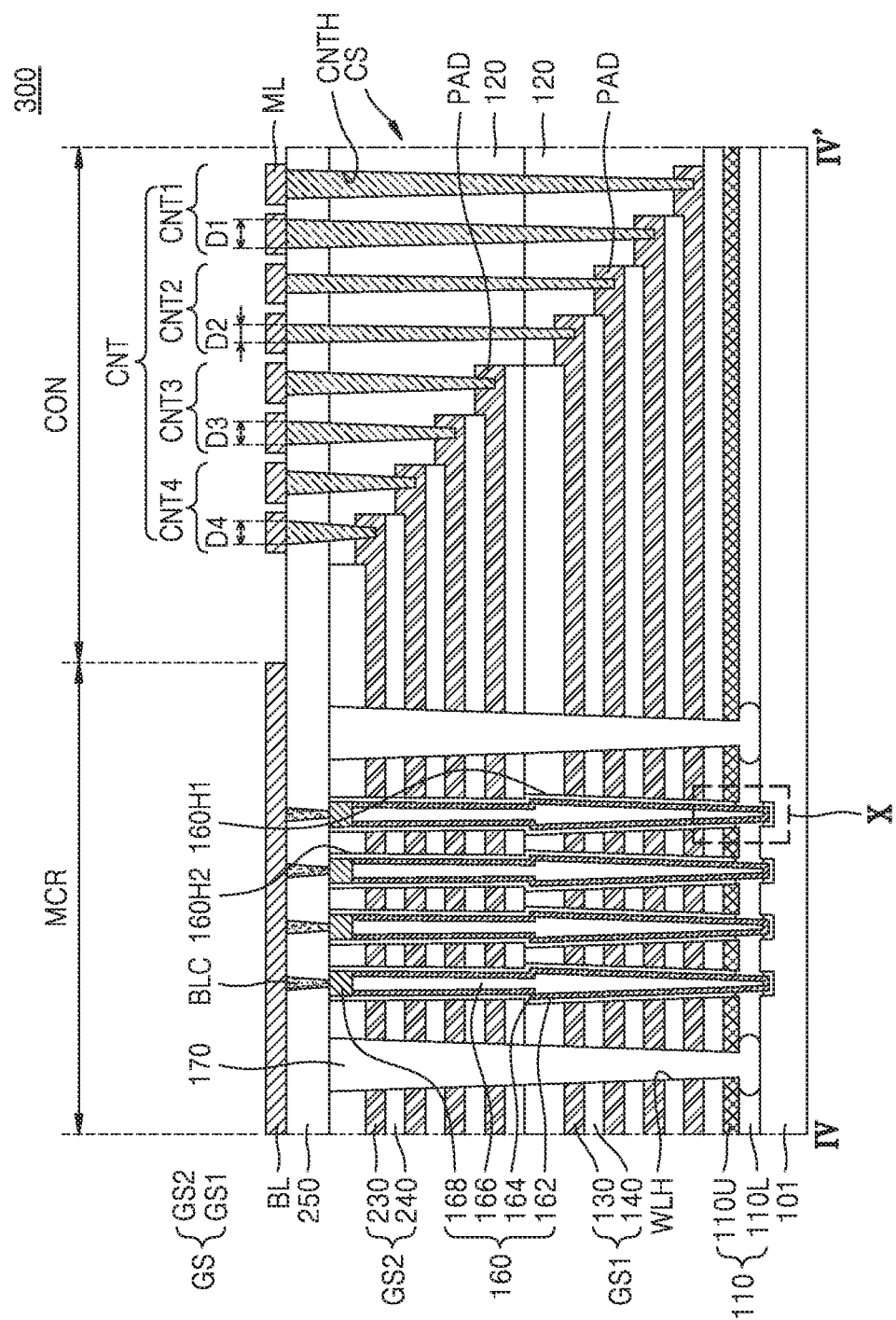
Figure 10:
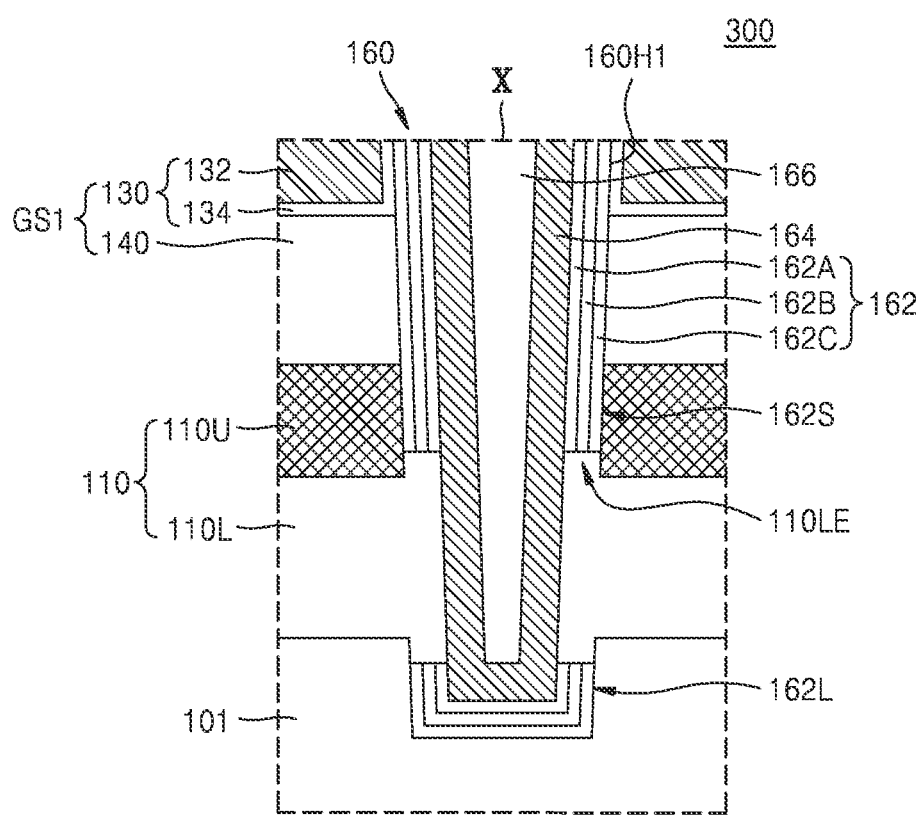

Referring to FIGS. 9 and 10, the integrated circuit device 300 may include a first gate stack GS1 and a second gate stack GS2 over the first gate stack GS1.

In the integrated circuit device 300 of FIGS. 9 and 10, the first gate stack GS1 may include first gate electrodes 130 and first insulating layers 140 alternately stacked in the third direction. Also, a first upper insulating layer may be arranged on an uppermost portion of the first gate stack GS1.

The second gate stack GS2 may include second gate electrodes 230 and second insulating layers 240, alternately stacked in the third direction. Also, a second upper insulating layer 250 may be arranged on an uppermost portion of the second gate stack GS2. In the connection region CON, the first gate stack GS1 may have a first stair-stepped structure, and the second gate stack GS2 may have a second stair-stepped structure.

The channel structures 160 may extend in a first channel hole 160H1 passing through the first gate stack GS1 and a second channel hole 160H2 passing through the second gate stack GS2. The channel structures 160 may have a shape that outwardly protrudes at a boundary between the first channel hole 160H1 and the second channel hole 160H2.

The channel structures 160 may pass through the base structure 110 including an upper base layer 110U and a lower base layer 110L to contact the semiconductor substrate 101. The gate insulating layer 162 may be removed at a same level as the lower base layer 110L and the channel layer 164 may contact an extension portion 110LE of the lower base layer 110L. A side wall portion 162S and a bottom portion 162L of the gate insulating layer 162 may be spaced apart with the extension portion 110LE of the lower base layer 110L therebetween, and the bottom portion 162L of the gate insulating layer 162 may be arranged to surround a bottom surface of the channel layer 164. Accordingly, the channel layer 164 may be electrically connected to the lower base layer 110L, instead of directly contacting the semiconductor substrate 101.

In the illustrated embodiment of FIGS. 9 and 10, the contact plug CNT may include first through fourth contact plug portions CNT1, CNT2, CNT3, and CNT4. That is, the first through fourth contact plug portions CNT1, CNT2, CNT3, and CNT4 may include first contact plug portions CNT1 vertically extending to contact gate electrodes arranged in a lower portion of the first stair-stepped structure, second contact plug portions CNT2 vertically extending to contact gate electrodes arranged in a upper portion of the first stair-stepped structure, third contact plug portions CNT3 vertically extending to contact gate electrodes arranged in a lower portion of the second stair-stepped structure, and fourth contact plug portions CNT4 vertically extending to contact gate electrodes arranged in an upper portion of the second stair-stepped structure.

Here, the second diameter D2 for the second contact plug portions CNT2 may be less than the first, third, and fourth diameters D1, D3, and D4 for the first, third, and fourth contact plug portions CNT1, CNT3, and CNT4. Also, the first diameter D1 may be greater than the third and fourth diameters D3 and D4.

Figure 11:
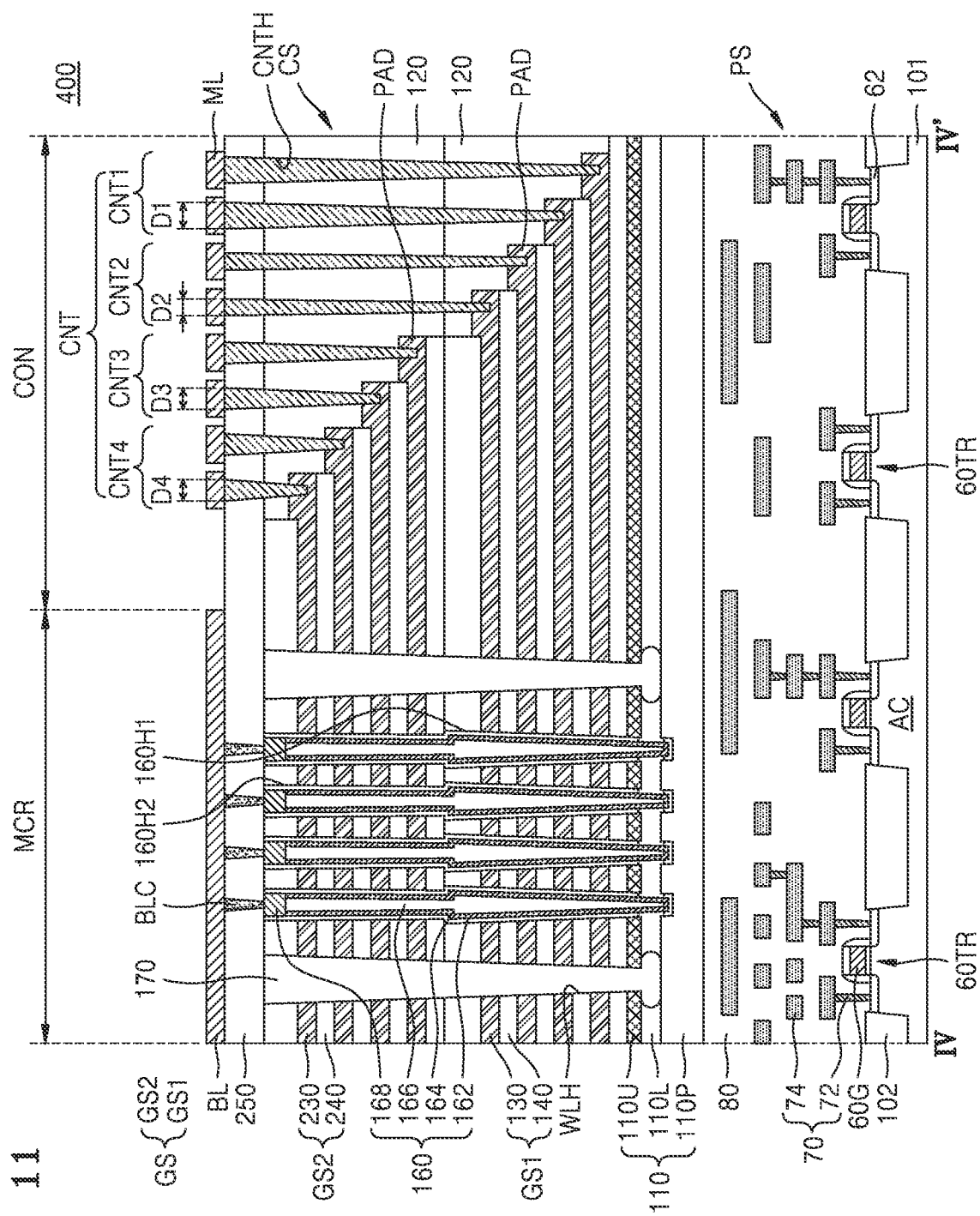

Referring to FIG. 11, the integrated circuit device 400 may include the peripheral circuit structure PS of FIG. 8, and the first gate stack GS1 and the second gate stack GS2 of FIG. 9. Hence, the integrated circuit device 400 has features of both the integrated circuit device 200 and the integrated circuit device 300.

Figure 12:
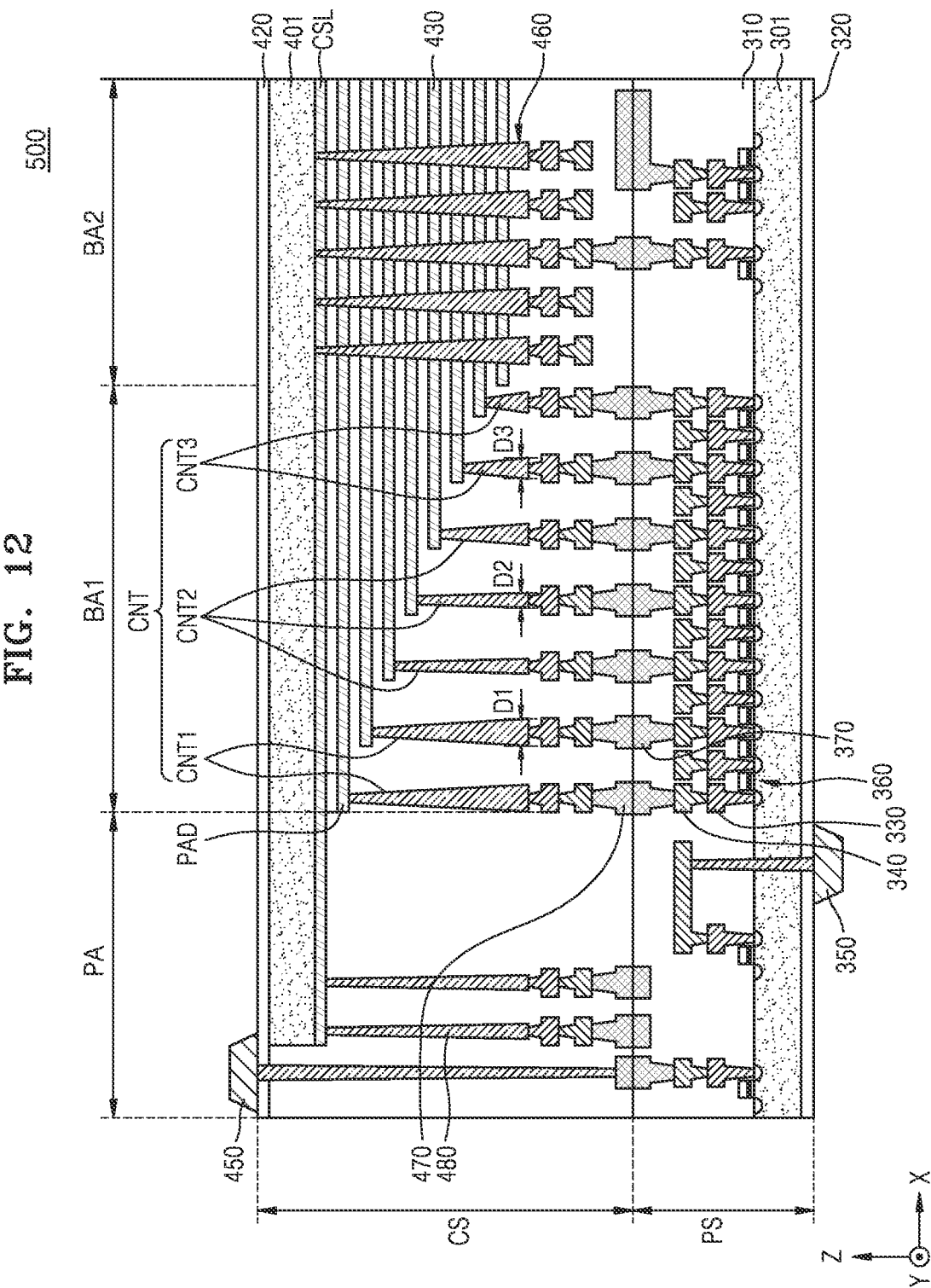

Referring to FIG. 12, the integrated circuit device 500 may have a chip-to-chip structure. That is, the integrated circuit device 500 has a chip-to-chip structure which may be formed by manufacturing an upper chip including a cell array structure CS and a lower chip including a peripheral circuit structure PS and then connecting the upper chip and the lower chip to each other by using a bonding method.

Here, in some embodiments, the bonding method may refer to a method in which a bonding pad formed in an uppermost portion of an upper chip is brought into contact with a bonding pad formed in an uppermost portion of a lower chip. The bonding method may include a metal-metal bonding structure, a through silicon via (TSV), a back via stack (BVS), a eutectic bonding structure, a ball grid array (BGA) bonding structure, wiring lines, or a combination thereof.

The peripheral circuit structure PS may include a circuit board 301, an interlayer insulating layer 310, circuit elements 360, a first metal layer 330 connected to each of the circuit elements 360, and a second metal layer 340 formed on the first metal layer 330.

The interlayer insulating layer 310 may be arranged on the circuit board 301 to cover the circuit elements 360, the first metal layer 330, and the second metal layer 340, and include an insulating material.

A lower bonding pad 370 may be formed on the second metal layer 340 in a word line bonding area BA1. In the word line bonding area BA1, the lower bonding pad 370 of the peripheral circuit structure PS may be electrically connected to an upper bonding pad 470 of the cell array structure CS by using a bonding method.

The cell array structure CS may provide at least one memory block. The cell array structure CS may include a cell substrate 401 and a common source line CSL. Word lines 430 may be stacked on the cell substrate 401 in the third direction.

In a bit line bonding area BA2, a channel structure 460 may pass through the word lines 430, string select lines, and a ground select line in the third direction.

In the word line bonding area BA1, the word lines 430 may extend in parallel to an upper surface of the cell substrate 401 and be connected to the contact plugs CNT. The word lines 430 and the contact plugs CNT may be connected in the pad portion PAD provided as at least some of the word lines 430 extend at different lengths.

In an external pad bonding are PA, a common source line contact 480 may be arranged. The common source line contact 480 may include a conductive material such as a metal, a metal compound, or polysilicon, and may be electrically connected to the common source line CSL.

In the external pad bonding are PA, first and second I/O pads 350 and 450 may be arranged. A lower layer 320 covering a lower surface of the circuit board 301 may be formed under the circuit board 301, and the first I/O pad 350 may be formed on the lower layer 320. An upper layer 420 covering the upper surface of the cell substrate 401 may be formed on the cell substrate 401, and the second I/O pad 450 may be arranged on the upper layer 420.

Here, the second diameter D2 of the second contact plugs CNT2 may be less than the first and third diameters D1 and D3 of the first and third contact plugs CNT1 and CNT3. Also, the first diameter D1 may be greater than the third diameter D3.

FIGS. 13A to 13E are related cross-sectional views illustrating a method of manufacturing an integrated circuit device according to embodiments of the inventive concept.

Figure 13A:
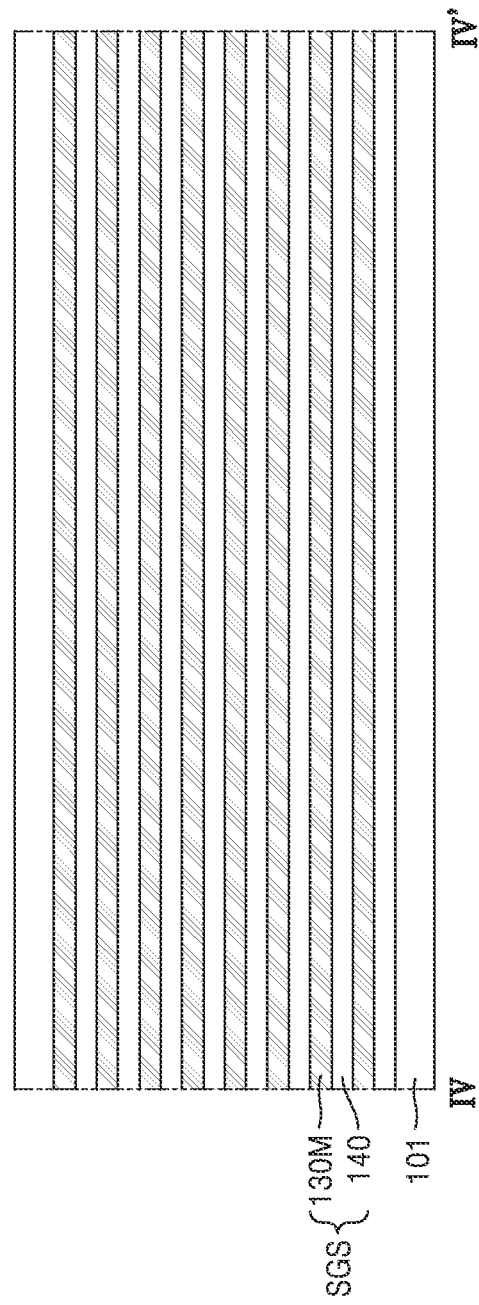
FIGS. 13A, 13B, 13C, 13D and 13E (collectively, "FIGS. 13A to 13E") are related cross-sectional views illustrating a method of manufacturing an integrated circuit device according to an embodiment of the inventive concept.

Referring to FIG. 13A, a sacrificial gate stack SGS may be formed on a semiconductor substrate 101.

The sacrificial gate stack SGS may be formed by alternately layering insulating layers 140 and mold layers 130M on a principal surface of the semiconductor substrate 101.

In some embodiments, the insulating layers 140 may include an insulating material such as silicon oxide, silicon oxynitride, or the like. The mold layers 130M may include a different material from that of the insulating layers 140, and the mold layers 130M may include silicon nitride, silicon oxynitride, or impurity-doped polysilicon.

Figure 13B:
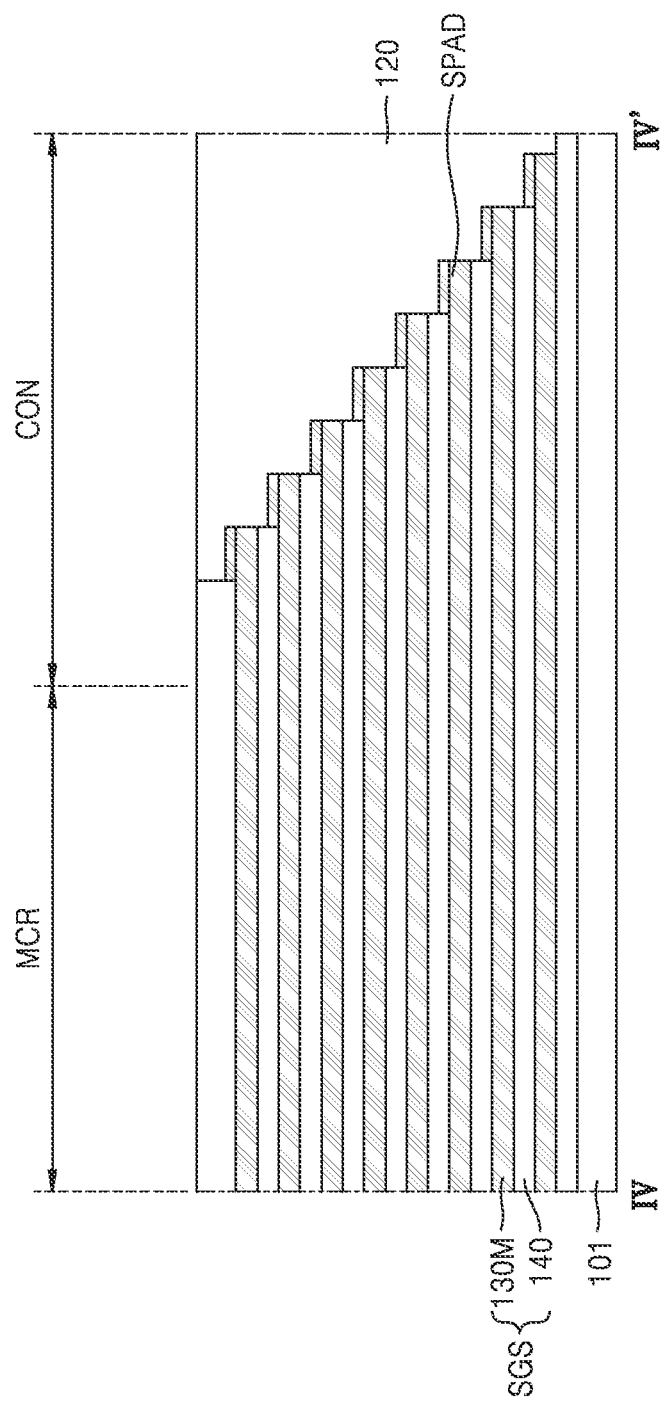

Referring to FIG. 13B, in the connection region CON, a sacrificial pad portion SPAD may be formed by sequentially patterning the sacrificial gate stack SGS.

The sacrificial gate stack SGS may include a memory cell region MCR and a connection region CON, and may include the sacrificial pad portion SPAD at an end portion of the mold layers 130M in the connection region CON. Also, the sacrificial pad portion SPAD may have an increased thickness through an additional process. Accordingly, the sacrificial pad portion SPAD may have an upper surface higher than other portions of the mold layer 130M.

Also, the cover insulating layer 120 covering the sacrificial pad portion SPAD may be formed. The cover insulating layer 120 may include an insulating material such as silicon oxide, silicon nitride, silicon oxynitride, or the like.

Figure 13C:
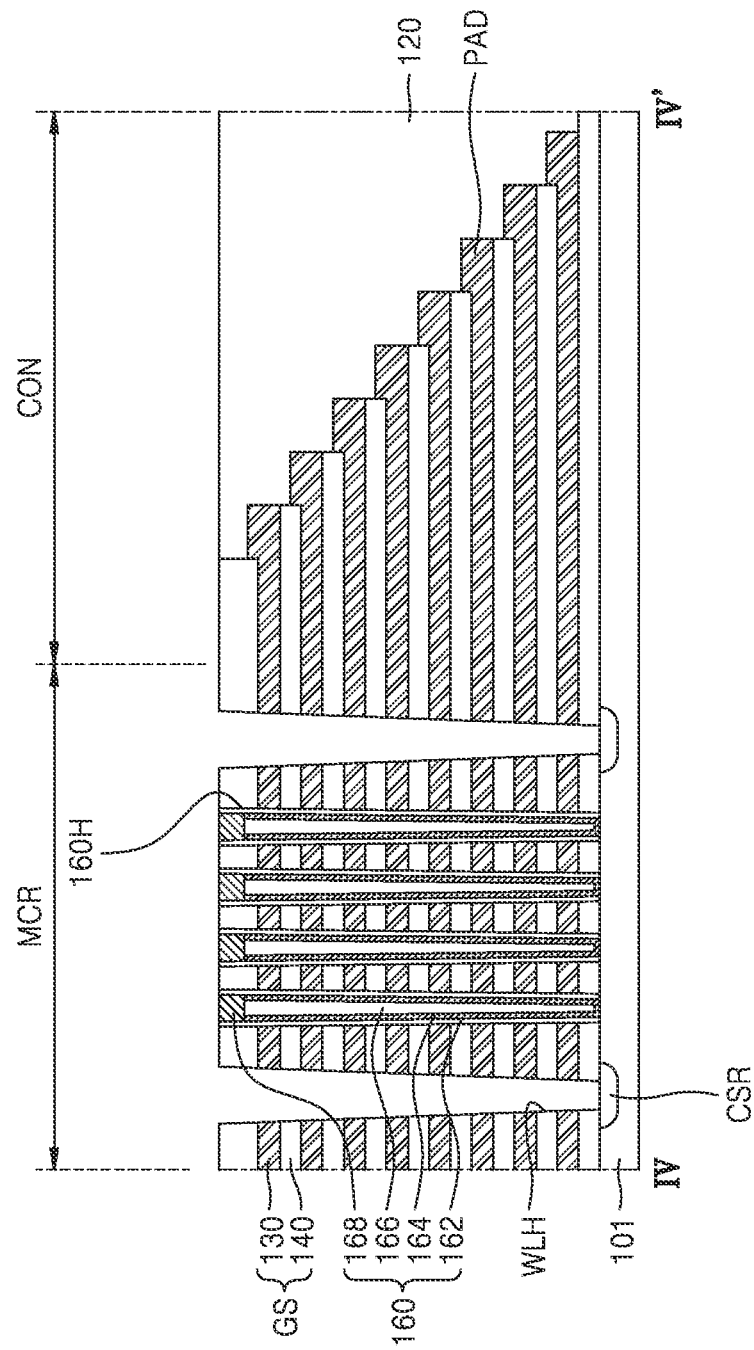

Referring to FIG. 13C, the sacrificial gate stack SGS may be further patterned to form a channel hole 160H, and a channel structure 160 including, on an inner wall of the channel hole 160H, a gate insulating layer 162, a channel layer 164, a buried insulating layer 166, and a conductive plug 168 may be formed.

A word line cut opening WLH may be formed by removing a portion of the sacrificial gate stack SGS. The mold layers 130M exposed on a sidewall of the word line cut opening WLH may be removed, and a conductive material may be buried in portions from which the mold layers 130M are removed, to form the gate electrodes 130. That is, a replacement process of forming the gate electrodes 130 by substituting a sacrificial layer with an electrode layer may be performed. Accordingly, the sacrificial gate stack SGS may be the gate stack GS, and the sacrificial pad portion SPAD may be the pad portion PAD.

Figure 13D:
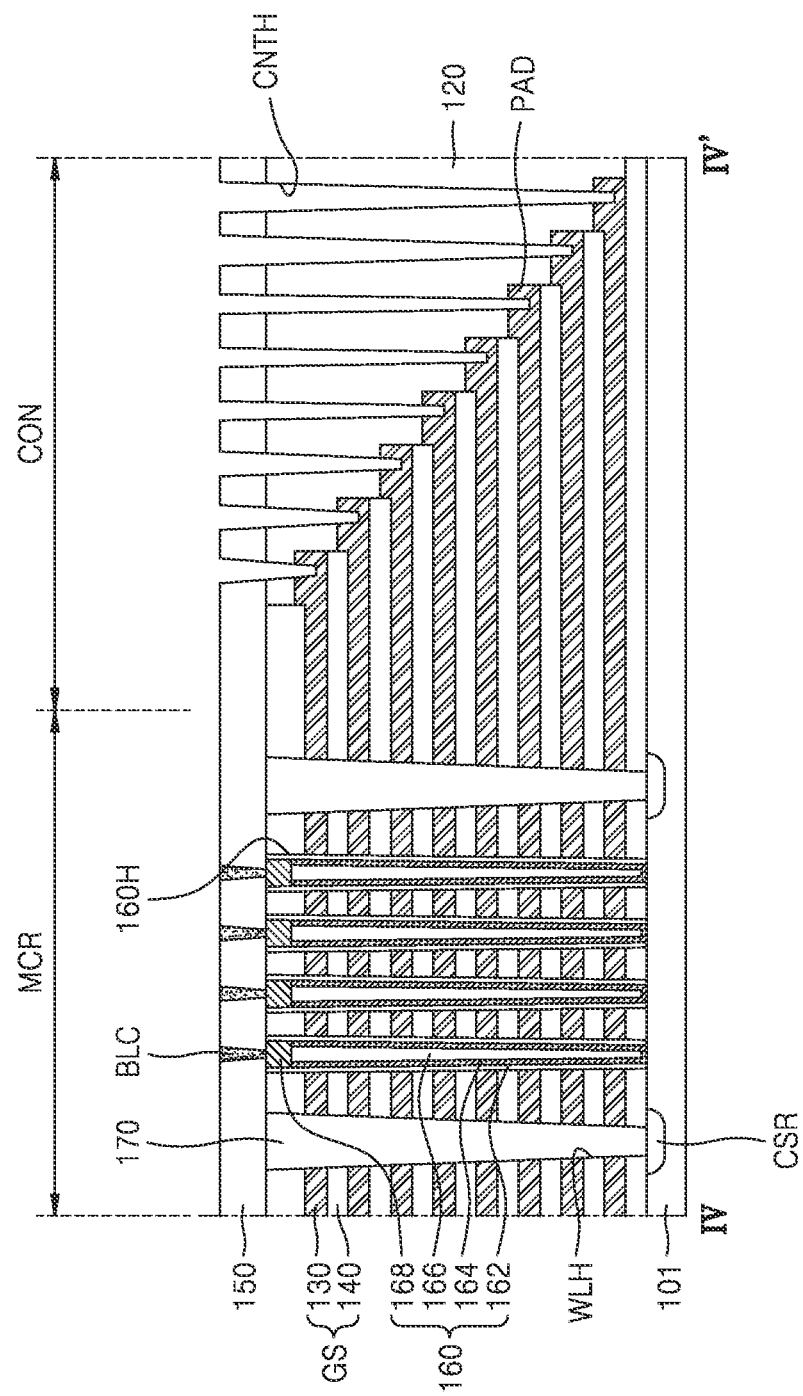

Referring to FIG. 13D, a word line cut 170 may be formed by filling an insulating material in the word line cut opening WLH.

The upper insulating layer 150 may be formed on the gate stack GS, and a contact hole CNTH passing through the upper insulating layer 150 and the cover insulating layer 120 to expose an upper surface of the pad portion PAD may be formed.

In some embodiments, the contact hole CNTH may be configured such that uppermost surfaces of the contact plug portions have different diameters depending on positioning of the contact plug portions. (See, e.g., FIG. 13E).

A bit line contact BLC passing through the upper insulating layer 150 to be electrically connected to the channel structure 160 may be formed.

Figure 13E:
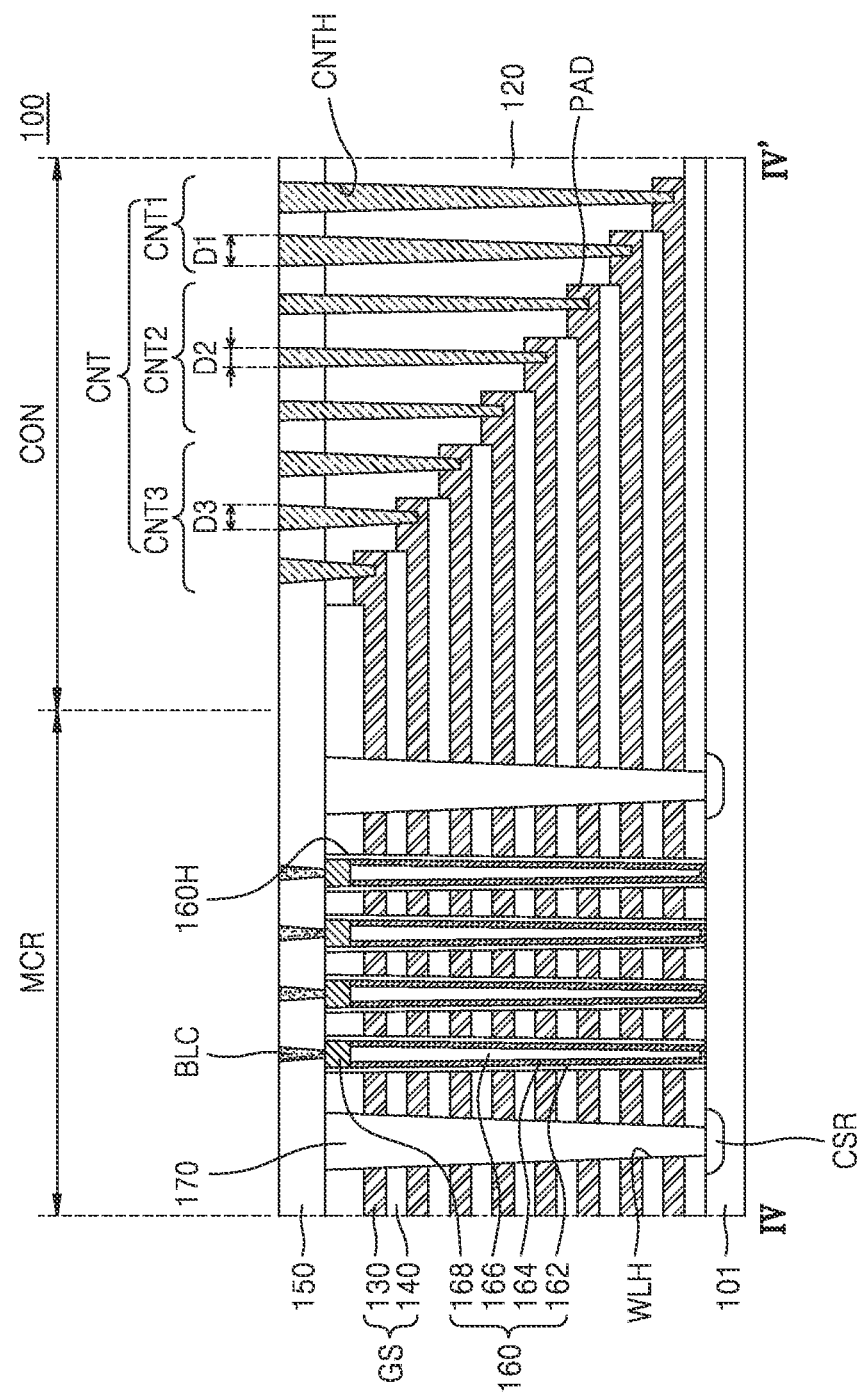

Referring to FIG. 13E, the contact hole CNTH may be filled with a conductive material to form the contact plugs CNT electrically connected to the pad portion PAD.

Here, the uppermost surfaces of the contact plug portion CNT1, CNT2, CNT3 have different diameters depending on positioning and respective connection purposes. That is, uppermost surfaces of the first contact plug portions CNT1 may have a first diameter D1, uppermost surfaces of the second contact plug portions CNT2 may have a second diameter D2, and uppermost surfaces of the third contact plug portions CNT3 may have a third diameter D3.

Referring to FIG. 4, the bit line BL electrically connected to the bit line contact BLC may be formed on the upper insulating layer 150, and the conductive line ML electrically connected to the contact plug CNT may be formed on the upper insulating layer 150. That is, by performing the above-described operations, the integrated circuit device 100 may be manufactured.

Figure 14:
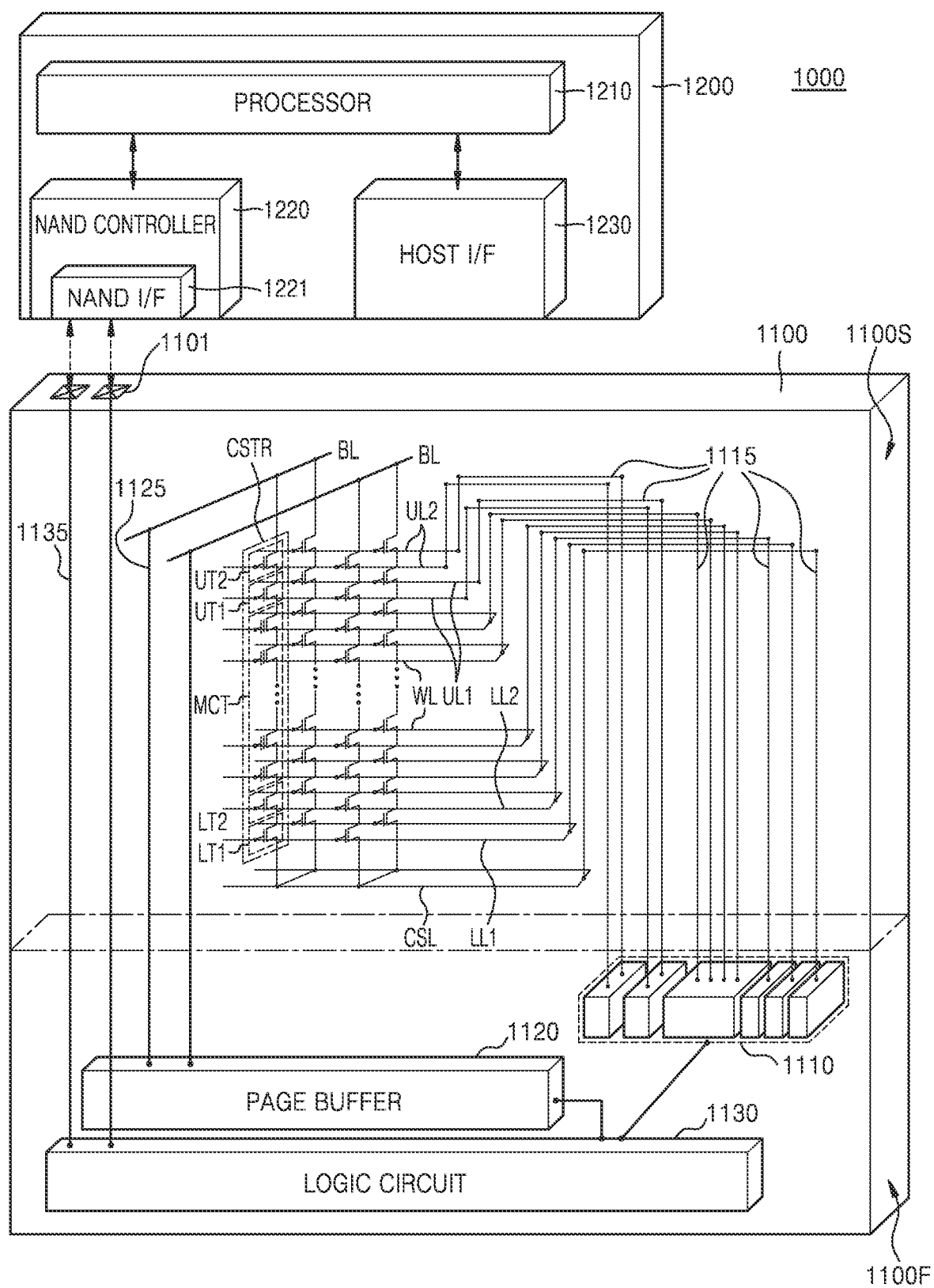
FIG. 14 is a conceptual diagram illustrating an electronic system including an integrated circuit device according to an embodiment of the inventive concept.

FIG. 14 is a conceptual diagram illustrating an electronic system 1000 including an integrated circuit device according to embodiments of the inventive concept.

Referring to FIG. 14, the electronic system 1000 may include an integrated circuit device 1100 and a controller 1200 electrically connected to the integrated circuit device 1100.

The electronic system 1000 may include a storage device including one or more integrated circuit devices 1100 or an electronic device including the storage device. For example, the electronic system 1000 may include a solid state drive (SSD) device, a universal serial bus (USB) device, a computing device, a medical equipment, or a communication device including at least one integrated circuit device 1100.

The integrated circuit device 1100 may include a nonvolatile vertical memory device. For example, the integrated circuit device 1100 may include a NAND flash memory device including at least one of the integrated circuit devices 100, 200, 300, 400, and 500 described above with reference to FIGS. 3 through 12. The integrated circuit device 1100 may include a first structure 1100F and a second structure 1100S on the first structure 1100F. In some embodiments, the first structure 1100F may be arranged next to the second structure 1100S.

The first structure 1100F may include a peripheral circuit structure including a decoder circuit 1110, a page buffer 1120, and a logic circuit 1130. The second structure 1100S may include a memory cell structure including bit lines BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, the memory cell strings CSTR may each include lower transistors LT1 and LT2 that are adjacent to the common source line CSL, upper transistors UT1 and UT2 that are adjacent to the bit line BL, and memory cell transistors MCT arranged between the lower transistors LT1 and LT2 and the upper transistors UT1 and UT2. The number of lower transistors LT1 and LT2 and the number of the upper transistors UT1 and UT2 may be modified in various manners according to embodiments.

In some embodiments, the upper transistors UT1 and UT2 may include a string select transistor, and the lower transistors LT1 and LT2 may include a ground select transistor. The gate lower lines LL1 and LL2 may be respectively gate electrodes of the lower transistors LT1 and LT2. The word lines WL may be gate electrodes of the memory cell transistors MCT, and the gate upper lines UL1 and UL2 may be gate electrodes of the upper transistors UT1 and UT2.

The common source line CSL, the gate lower lines LL1 and LL2, the word lines WL, and the gate upper lines UL1 and UL2 may be electrically connected to the decoder circuit 1110 via first connection wirings 1115 extending to the second structure 1100S in the first structure 1100F. The bit lines BL may be electrically connected to the page buffer 1120 via second connection wirings 1125 extending to the second structure 1100S in the first structure 1100F.

In the first structure 1100F, the decoder circuit 1110 and the page buffer 1120 may perform a control operation on at least one of the memory cell transistors MCT. The decoder circuit 1110 and the page buffer 1120 may be controlled by the logic circuit 1130.

The integrated circuit device 1100 may communicate with the controller 1200 via an I/O pad 1101 electrically connected to the logic circuit 1130. The I/O pad 1101 may be electrically connected to the logic circuit 1130 via an I/O connection wiring 1135 extending to the second structure 1100S in the first structure 1100F.

The controller 1200 may include a processor 1210, a NAND controller 1220, and a host interface 1230. In some embodiments, the electronic system 1000 may include integrated circuit devices 1100, and in this case, the controller 1200 may control the integrated circuit devices 1100.

The processor 1210 may control the overall operation of the electronic system 1000 including the controller 1200. The processor 1210 may operate according to certain firmware, and may control the NAND controller 1220 to access the integrated circuit devices 1100. The NAND controller 1220 may include a NAND interface 1221 processing communication with the integrated circuit devices 1100. A control command for controlling the integrated circuit devices 1100, data to be stored in memory cell transistors MCT of the integrated circuit devices 1100, data to be read from the memory cell transistors MCT of the integrated circuit devices 1100, or the like may be transmitted through the NAND interface 1221. The host interface 1230 may provide a communication function between the electronic system 1000 and an external host. When receiving a control command from an external host via the host interface 1230, the processor 1210 may control the integrated circuit devices 1100 in response to the control command.

Figure 15:
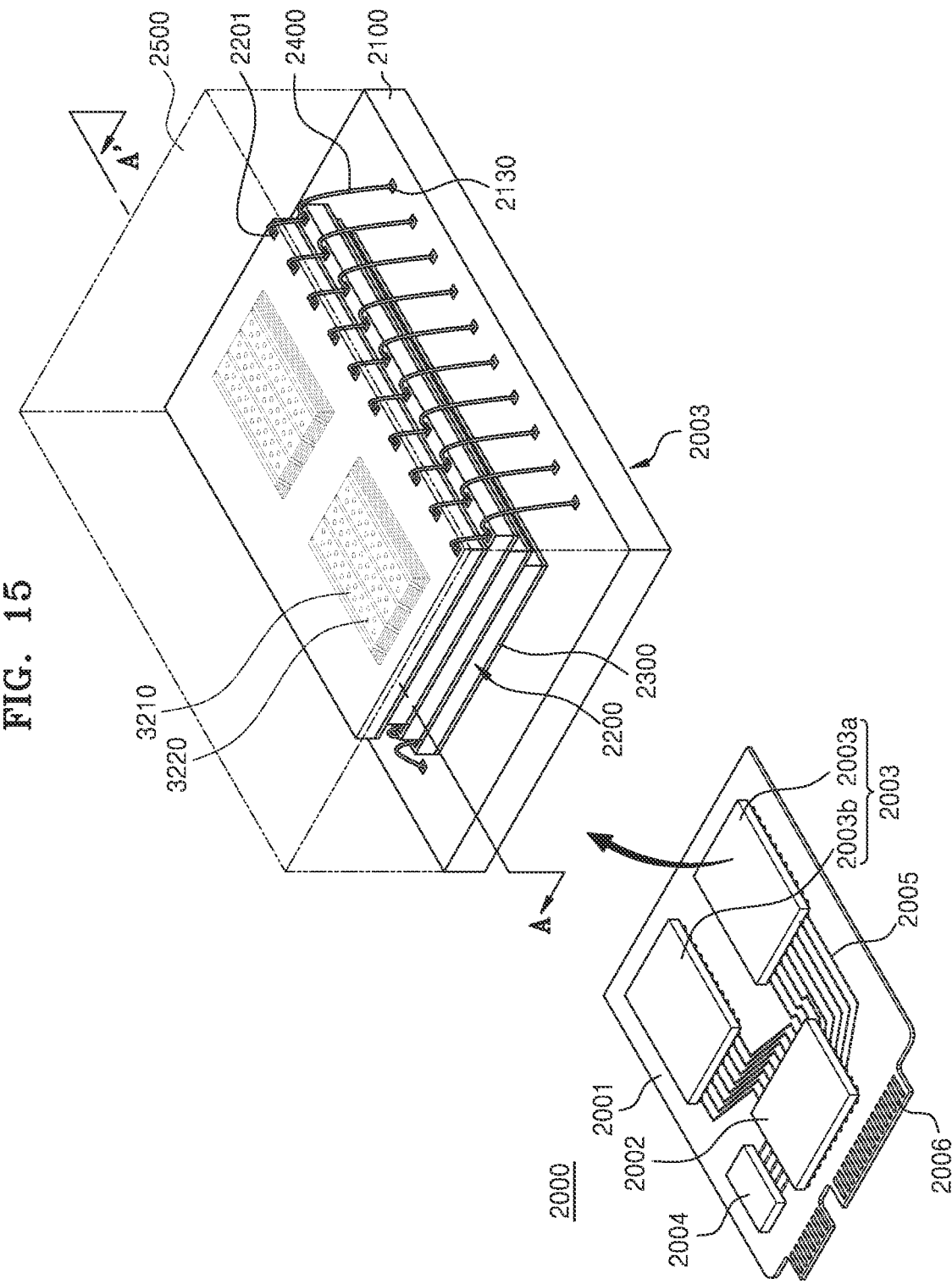
FIG. 15 is a perspective view further illustrating an electronic system including an integrated circuit device according to an embodiment of the inventive concept.

FIG. 15 is a perspective view of an electronic system including an integrated circuit device according to an embodiment.

Referring to FIG. 15, an electronic system 2000 according to the embodiment of the inventive concept may include a principal substrate 2001, a controller 2002 mounted on the principal substrate 2001, at least one semiconductor package 2003, and a dynamic random access memory (DRAM) 2004.

The principal substrate 2001 may include a connector 2006 including pins coupled to an external host. In the connector 2006, the number and arrangement of the pins may vary according to a communication interface between the electronic system 2000 and the external host. In some embodiments, the electronic system 2000 may communicate with an external host according to one of interfaces such as USB, Peripheral Component Interconnect Express (PCI-Express), Serial Advanced Technology Attachment (SATA), or M-Phy for Universal Flash Storage (UFS). In some embodiments, the electronic system 2000 may operate by power supplied from an external host via the connector 2006. The electronic system 2000 may further include a power management integrated circuit (PMIC) that distributes power received from the external host to the at least one semiconductor package 2003. The at least one semiconductor package 2003 and the DRAM 2004 may be connected to the controller 2002 via wiring patterns 2005 formed on the principal substrate 2001.

The controller 2002 may record data to the at least one semiconductor package 2003, read data from the at least one semiconductor package 2003, or improve an operating rate of the electronic system 2000.

The DRAM 2004 may include a buffer memory to mitigate a difference in speeds of the at least one semiconductor package 2003, which is a data storage space, and an external host. The DRAM 2004 included in the electronic system 2000 may operate as a type of cache memory, and provide space to temporarily store data in a control operation on the at least one semiconductor package 2003. When the DRAM 2004 is included in the electronic system 2000, the controller 2002 may further include a DRAM controller to control the DRAM 2004, in addition to a NAND controller for controlling the at least one semiconductor package 2003.

The at least one semiconductor package 2003 may include first and second semiconductor packages 2003a and 2003b. Each of the first and second semiconductor packages 2003a and 2003b may include a semiconductor package including semiconductor chips 2200. Each of the first and second semiconductor packages 2003a and 2003b may include a package substrate 2100, semiconductor chips 2200 on the package substrate 2100, an adhesive layer 2300 arranged on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an I/O pad 2201. The I/O pad 2201 may correspond to the I/O pad 1101 of FIG. 14. Each of the semiconductor chips 2200 may include gate stacks 3210 and channel structures 3220. For example, the semiconductor chips 2200 may include at least one of the integrated circuit devices 100, 200, 300, 400, and 500 described above with reference to FIGS. 3 through 12.

In some embodiments, the connection structure 2400 may include a bonding wire electrically connecting the I/O pad 2201 to the package upper pads 2130. Accordingly, in the first and second semiconductor packages 2003a and 2003b, the semiconductor chips 2200 may be electrically connected to each other by using a bonding wire method, and may be electrically connected to the package upper pads 2130 of the package substrate 2100. In some embodiments, in the first and second semiconductor packages 2003a and 2003b, the semiconductor chips 2200 may be electrically connected to each other via a connection structure including a TSV, instead of the connection structure 2400 using a bonding wire method.

In some embodiments, the controller 2002 and the semiconductor chips 2200 may be included in a single package. In some embodiments, the controller 2002 and the semiconductor chips 2200 may be mounted on the principal substrate 2001 and another, additional interposer substrate, and the controller 2002 and the semiconductor chips 2200 may be connected to each other via a wiring formed on the interposed substrate.

Figure 16:
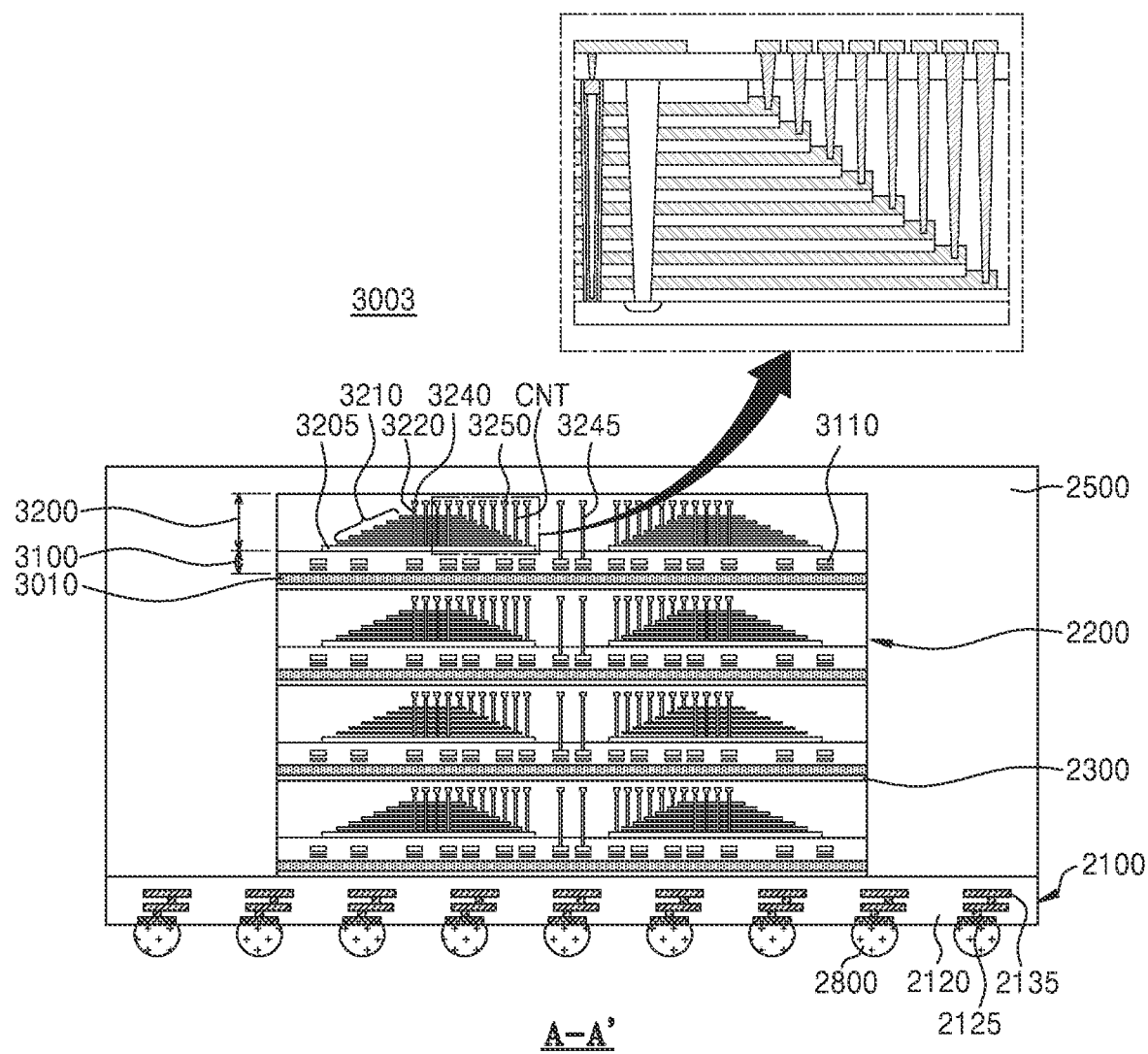
FIGS. 16 and 17 are respective, cross-sectional views illustrating a semiconductor package including an integrated circuit device according to an embodiment of the inventive concept.
Figure 17:
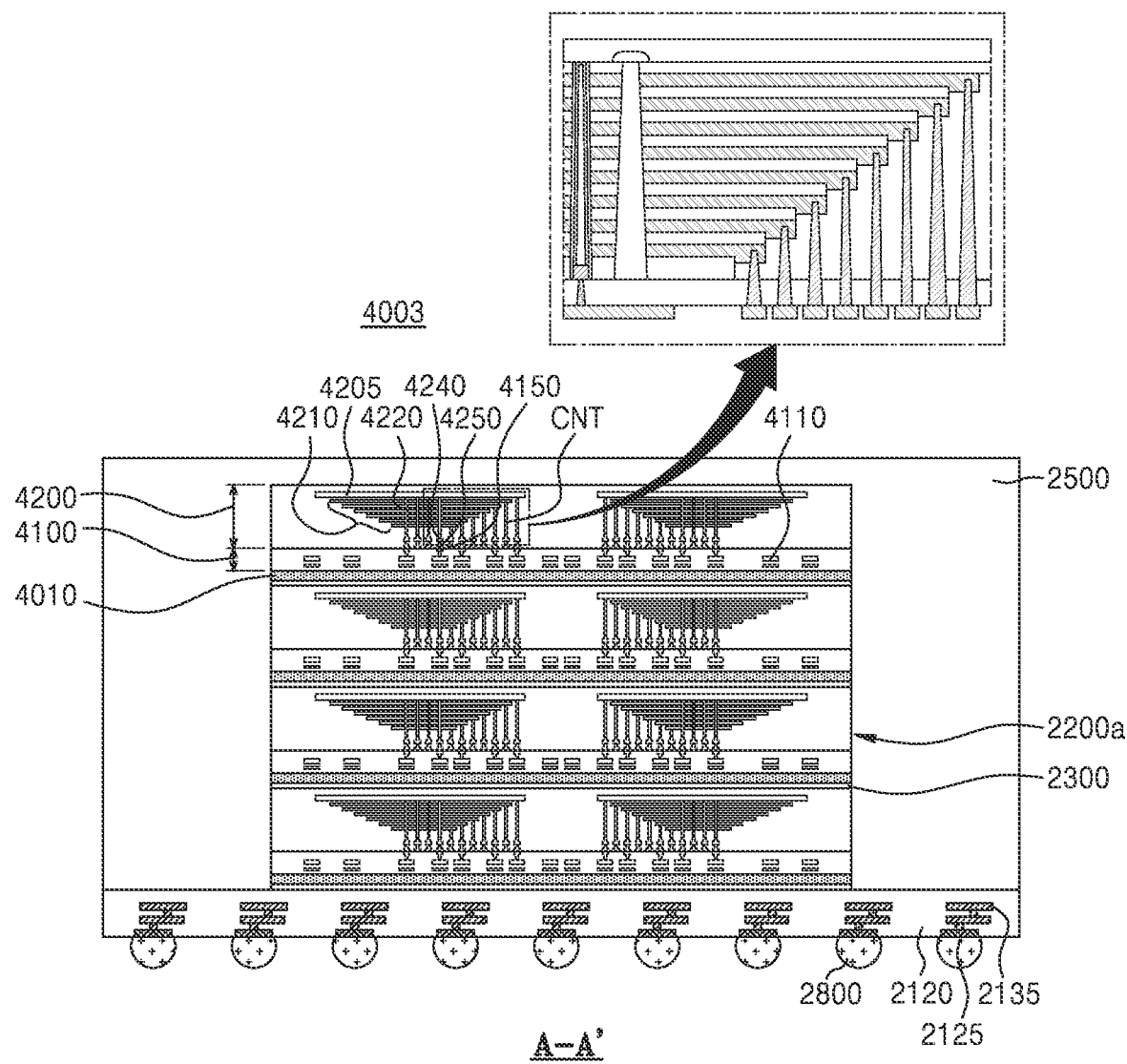

FIGS. 16 and 17 are cross-sectional views illustrating a semiconductor package including an integrated circuit device according to an embodiment.

In FIGS. 16 and 17, a configuration of a cross-sectional view taken along line A-A' of FIG. 15 is illustrated in detail.

Referring to FIG. 16, in a semiconductor package 3003, the package substrate 2100 may be a printed circuit board.

The package substrate 2100 may include a body portion 2120, package upper pads 2130 (see FIG. 15) arranged on an upper surface of the body portion 2120, lower pads 2125 arranged on a lower surface of the body portion 2120 or exposed through the lower surface of the body portion 2120, and internal wirings 2135 electrically connecting the upper pads 2130 to the lower pads 2125 in the body portion 2120. The upper pads 2130 may be electrically connected to connection structures 2400 (see FIG. 15). The lower pads 2125 may be connected to wiring patterns 2005 on the principal substrate 2001 of the electronic system 2000 illustrated in FIG. 15 via conductive connection portions 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including a peripheral wirings 3110. The first structure 3100 may include the peripheral circuit transistor 60TR as described with reference to FIG. 8. While the first structure 3100 is illustrated as having a same structure as a peripheral circuit structure of the integrated circuit device 200 illustrated in FIG. 8, the inventive concept is not limited thereto.

The second structure 3200 may include a common source line 3205, a gate stack 3210 on the common source line 3205, a channel structure 3220 passing through the gate stack 3210, and a bit line 3240 electrically connected to the channel structure 3220. The gate stack 3210 may include the first and second gate stacks GS1 and GS2 illustrated in FIG. 9. The first and second gate stacks GS1 and GS2 may include gate electrodes 130. Also, each of the semiconductor chips 2200 may include contact plug CNT electrically connected to the gate electrodes 130.

Each of the semiconductor chips 2200 may be electrically connected to the peripheral wirings 3110 of the first structure 3100, and may include a through wiring 3245 extending into the second structure 3200. The through wiring 3245 may be arranged outside the gate stack 3210. In other embodiments, the semiconductor package 3003 may further include a through wiring passing through the gate stack 3210. Each of the semiconductor chips 2200 may further include an I/O pad 2201 (see FIG. 15) electrically connected to the peripheral wirings 3110 of the first structure 3100.

Referring to FIG. 17, a semiconductor package 4003 has a similar configuration as the semiconductor package 3003 described with reference to FIG. 16. However, the semiconductor package 4003 includes semiconductor chips 2200a.

Each of the semiconductor chips 2200a may include a semiconductor substrate 4010, a first structure 4100 on the semiconductor substrate 4010, and a second structure 4200 bonded to the first structure 4100 on the first structure 4100 by using a wafer bonding method.

The first structure 4100 may include a peripheral circuit region including a peripheral wiring 4110 and first bonding structures 4150. The first structure 4100 may include the peripheral circuit transistors 60TR as described with reference to FIG. 8. While the first structure 4100 is illustrated as having a same structure as a peripheral circuit structure of the integrated circuit device 200 illustrated in FIG. 8, the inventive concept is not limited thereto.

The second structure 4200 may include a common source line 4205, a gate stack 4210 between the common source line 4205 and the first structure 4100, and a channel structure 4220 passing through the gate stack 4210. The gate stack 4210 may include the first and second gate stacks GS1 and GS2 illustrated in FIG. 9. The first and second gate stacks GS1 and GS2 may include a gate electrodes 130. Also, each of the semiconductor chips 2200a may include contact plugs CNT electrically connected to the gate electrodes 130.

Also, each of the semiconductor chips 2200a may include second bonding structures 4250 respectively electrically connected to the gate electrodes 130 of the gate stack 4210. For example, some of the second bonding structures 4250 may be configured to be connected to a bit line 4240 electrically connected to the channel structure 4220. Others of the second bonding structures 4250 may be configured to be electrically connected to the gate electrodes 130 via the contact plugs CNT.

The first bonding structures 4150 of the first structure 4100 and the second bonding structures 4250 of the second structure 4200 may be bonded to each other while contacting each other. Portions of the first bonding structures 4150 and the second bonding structures 4250 that are bonded to each other may include a metal such as copper (Cu), but are not limited thereto.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a semiconductor substrate having a cell region and a connection region adjacent to the cell region;
   a gate stack including gate electrodes and insulating layers alternately stacked and having a stair-stepped structure in the connection region covered by a cover insulating layer,
   wherein each one of the gate electrodes extends from the cell region to the connection region to terminate in a corresponding pad portion, and the gate electrodes include lower gate electrodes disposed in a lower portion of the stair-stepped structure, upper gate electrodes disposed in an upper portion of the stair-stepped structure, and middle gate electrodes disposed between the lower gate electrodes and the upper gate electrodes; and
   a contact plug disposed in the connection region and comprising:
   first contact plug portions extending through the cover insulating layer to respectively contact pad portions of the lower gate electrodes;
   second contact plug portions extending through the cover insulating layer to respectively contact pad portions of the middle gate electrodes; and
   third contact plug portions extending through the cover insulating layer to respectively contact pad portions of the upper gate electrodes,
   wherein a second diameter of at least one of the second contact plug portions at an uppermost surface of the at least one of the second contact plug portions is less than a first diameter of at least one of the first contact plug portions at an uppermost surface of the at least one of the first contact plug portions, and the second diameter is less than a third diameter of at least one of the third contact plug portions at an uppermost surface of the at least one of the third contact plug portions.

2. The integrated circuit device of claim 1, wherein the first diameter is greater than the second diameter, and the third diameter is greater than the second diameter and less than the first diameter.

3. The integrated circuit device of claim 2, wherein the second diameter ranges from about 90% to about 95% of the first diameter, and the second diameter ranges from about 95% to about 99% of the third diameter.

4. The integrated circuit device of claim 2, wherein another one of the first contact plug portions has a diameter different from the first diameter, each one of the second contact plug portions has the second diameter, and each one of the third contact plug portions has the third diameter.

5. The integrated circuit device of claim 4, wherein the at least one of the first contact plug portions contacts a pad portion of a lowermost gate electrode among the gate electrodes.

6. The integrated circuit device of claim 1, wherein the second contact plug portions respectively contact pad portions of gate electrodes disposed between ¼ to ½ of a height of the gate stack as measured from an upper surface of the semiconductor substrate.

7. The integrated circuit device of claim 1, wherein a distance between the cell region and any one of the first contact plug portions is greater than a distance between the cell region and any one of the second contact plug portions, and a distance between the cell region and any one of the third contact plug portions is less than a distance between the cell region and any one of the second contact plug portions.

8. The integrated circuit device of claim 1, wherein each one of the first contact plug portions, the second contact plug portions and the third contact plug portions has a tapered pillar shape.

9. The integrated circuit device of claim 1, wherein, for each gate electrode of the gate electrodes, an upper surface of a respective pad portion of the gate electrode is a highest portion of the gate electrode.

10. The integrated circuit device of claim 1, further comprising:

a peripheral circuit structure disposed between the semiconductor substrate and the gate stack.

* * * * *